US012770828B2

(12) United States Patent
Cui et al.

(10) Patent No.: US 12,770,828 B2
(45) **Date of Patent: *Oct. 20, 2026**

(54) MULTI-ELECTRODE SOURCE ASSEMBLY FOR PLASMA PROCESSING

(71) Applicant: Applied Materials, Inc., Santa Clara, CA (US)

(72) Inventors: Linying Cui, Cupertino, CA (US); James Rogers, Los Gatos, CA (US); Rajinder Dhindsa, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 651 days.

This patent is subject to a terminal disclaimer.

(21) Appl. No.: 18/138,730

(22) Filed: Apr. 24, 2023

(65) Prior Publication Data

US 2024/0355586 A1 Oct. 24, 2024

(51) Int. Cl.
*H01J 37/32* (2006.01)

(52) U.S. Cl.
CPC .. *H01J 37/32183* (2013.01); *H01J 37/32128* (2013.01); *H01J 37/32568* (2013.01); *H01J 2237/3343* (2013.01)

(58) Field of Classification Search
None
See application file for complete search history.

(56) References Cited

U.S. PATENT DOCUMENTS

2005/0241768 A1 11/2005 Kawamura et al.
2009/0155489 A1 6/2009 Schmitt et al.
2017/0309453 A1 10/2017 Bilolu et al.
(Continued)

FOREIGN PATENT DOCUMENTS

TW 202233022 A 8/2022
WO 2011039793 A1 4/2011
WO 2022108754 A1 5/2022

OTHER PUBLICATIONS

International Search Report and Written Opinion for Application No. PCT/US2024/013156 dated May 27, 2024.
(Continued)

*Primary Examiner* — Kenneth B Wells
(74) *Attorney, Agent, or Firm* — Patterson + Sheridan, LLP

(57) ABSTRACT

Apparatus and methods for controlling the uniformity of a plasma formed using a radio frequency (RF) source power assembly that includes one or more resonant tuning circuits coupled to two or more electrodes disposed within a multi-electrode source assembly. Improved plasma uniformity control and reduced system cost are achieved by eliminating multiple RF generators and matches that power the multiple electrodes separately. Multiple frequencies may also be provided to multiple electrodes at the same time, which can include another cost savings when using a multi-frequency RF source assembly. Local plasma density and sheath voltage over a surface of a substrate are controlled with segmented electrodes disposed within the processing region of a plasma processing chamber. The ion flux and direction, as well as energetic electron flux towards the substrate, are controlled to address the plasma non-uniformity and global tilt during processing of a semiconductor substrate.

23 Claims, 18 Drawing Sheets

(56) References Cited

U.S. PATENT DOCUMENTS

| | | | |
|---|---|---|---|
| 2018/0277351 A1 | 9/2018 | Kudela et al. | |
| 2019/0088452 A1* | 3/2019 | Yamada .............. | H01J 37/3299 |
| 2019/0393021 A1* | 12/2019 | Hironaka .......... | H01J 37/32128 |
| 2021/0319980 A1 | 10/2021 | Bhowmick et al. | |
| 2022/0020568 A1 | 1/2022 | Shindo et al. | |
| 2022/0375719 A1 | 11/2022 | Topping et al. | |
| 2022/0399193 A1 | 12/2022 | Cui et al. | |
| 2024/0355587 A1* | 10/2024 | Cui ................... | H01J 37/32183 |

OTHER PUBLICATIONS

Taiwanese Office Action for Application No. 113103514 dated Feb. 10, 2026.

* cited by examiner

Tuning Circuits

RF Voltage and Current Sensors

MULTI-ELECTRODE SOURCE ASSEMBLY FOR PLASMA PROCESSING

BACKGROUND

Field

Embodiments of the present disclosure generally relate to apparatus and methods to control radial plasma uniformity using resonant tuning circuits for a multi-electrode source in a plasma processing chamber

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards two nanometers (nm), the fabrication of smaller features with larger aspect ratios requires atomic precision for plasma processing. In a typical plasma-assisted etching process, the substrate is positioned on a substrate support disposed in a processing chamber, a plasma is formed over the substrate by use of a radio frequency (RF) generator that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF generator that is used to initiate and maintain the plasma in the processing chamber, have been used to control the plasma sheath properties to achieve desirable plasma processing results that will allow the formation of these smaller device feature sizes.

However, non-uniformities in the plasma density and/or in the shape of the plasma sheath can occur, due to the variations in the electrical characteristics of and/or spatial arrangement of the processing components disposed within a processing region of a plasma processing chamber. One common plasma density variation is created by the boundary effect of electromagnetic waves propagating inside the processing chamber. The variation in plasma will cause undesirable processing results in etched features formed across the surface of the substrate. Excessive variation in plasma non-uniformity will adversely affect the process results and reduce device yield. Such non-uniformities are often particularly pronounced near or between the center and edge of the substrate.

In a conventional capacitively coupled plasma (CCP) processing chamber, a radio frequency (RF) power source provides RF power to an electrode in the processing chamber for generating plasma therein, via an impedance matching network coupled between the RF power source and the electrode. For plasma radial uniformity control in the CCP processing chamber, the current state-of-the-art utilizes magnets or a multi-electrode approach. However, the conventional multi-electrode approach requires separate RF generators and associated impedance matching networks to provide RF power to the separate RF electrodes. The current state of the art CCP processing chambers are thus complex, hard to control and costly.

Hence, there is a need for a simplified and more cost-effective plasma generation system that solves the problems described above.

SUMMARY

Embodiments of the disclosure include a plasma processing chamber having an RF electrode assembly that at least partially defines a processing region of the plasma processing chamber. The RF electrode assembly has a first electrode that is positioned over at least a portion of the substrate supporting surface, is substantially parallel to a first plane, and is a first distance from the substrate supporting surface in a first direction that is perpendicular to the first plane. A second electrode has a surface that is substantially parallel to the first plane, where the second electrode and the first electrode are spaced a distance apart in a second direction that is parallel to the first plane. A radio frequency (RF) power source assembly has a first RF generator, an impedance matching network having an input coupled to the output of the first RF generator and an output coupled to the first electrode. A tuning circuit has an input coupled to the output of the impedance matching network and an output coupled to the second electrode, wherein the tuning circuit has a plurality of impedance producing elements that comprise a first variable impedance producing element. A controller is configured to control the impedance of the first variable impedance producing element to cause an RF magnitude difference between a first RF waveform provided to the first electrode and a second RF waveform provided to the second electrode through the first variable impedance producing element of the tuning circuit.

Embodiments of the disclosure include a plasma processing chamber having an RF electrode assembly that at least partially defines a processing region of the plasma processing chamber. The RF electrode assembly has a first electrode that is positioned over at least a portion of the substrate supporting surface, is substantially parallel to a first plane, and is a first distance from the substrate supporting surface in a first direction that is perpendicular to the first plane. A second electrode has a surface that is substantially parallel to the first plane, wherein the second electrode and the first electrode are spaced a distance apart in a second direction that is parallel to the first plane. A radio frequency (RF) power source assembly has a first RF generator configured to provide an RF signal at a first RF frequency, an impedance matching network having an input coupled to the output of the first RF generator and an output coupled to the first electrode. A tuning circuit has an input coupled to the output of the impedance matching network and an output coupled to the second electrode, wherein the tuning circuit comprises an LC circuit that has a resonant frequency around the first RF frequency, and comprises a first variable capacitor and a first inductor. A controller is configured to control the impedance of the first variable capacitor to cause an RF voltage magnitude and/or phase difference between a first RF waveform provided to the first electrode and the second RF waveform provided to the second electrode through the tuning circuit.

Embodiments of the disclosure include a plasma processing method which generates a plasma in a processing region defined by an electrode assembly and a substrate support assembly. The electrode assembly includes a first electrode and a second electrode. The second electrode is positioned a distance from the first electrode in a first direction. A first radio frequency (RF) generator has an RF output, through an impedance matching network, that is coupled to the first electrode. A tuning circuit is coupled between the impedance matching network and the second electrode, and the tuning circuit includes a plurality of impedance producing elements that have a first variable impedance producing element. The first RF generator generates a first RF waveform at the first electrode and a second RF waveform at the second electrode. The generated plasma is altered by adjusting a first variable impedance producing element of the tuning circuit which alters one or more characteristics of the second RF waveform relative to the first RF waveform.

Embodiments of the disclosure include an electrode assembly, comprising an electrode support plate, a first electrode coupled to the electrode support plate, and comprising an upper surface, a lower surface, and one or more gas delivery openings extending between the upper surface and the lower surface, a ground plate mounted over the electrode support plate, wherein the ground plate is electrically coupled to a ground reference. The ground plate includes a plurality of first ground plate features that each extend between a surface of the ground plate and an upper surface of the first electrode, wherein each first ground plate feature surrounds at least a portion of a gas distribution pipe that is configured to deliver a fluid to one of the one or more gas delivery openings. The electrode assembly also includes a first radio frequency (RF) delivery feature that at least partially surrounds a portion of a first ground plate feature of the plurality of ground plate features and is coupled to the upper surface of the first electrode.

Embodiments of the disclosure include a plasma processing chamber, comprising a substrate support assembly that comprises a substrate supporting surface that at least partially defines a processing region of the plasma processing chamber, an electrode support plate; a first electrode coupled to the electrode support plate, a second electrode coupled to the electrode support plate, a ground plate mounted over the electrode support plate, a first RF delivery feature coupled to the first electrode, and a second RF delivery feature coupled to the second electrode. The first electrode includes a first gas delivery opening formed therein, wherein the first electrode has a lower surface that is positioned over at least a portion of the substrate supporting surface, is substantially parallel to a first plane, and is a first distance from the substrate supporting surface in a first direction that is perpendicular to the first plane. The second electrode includes a second gas delivery opening formed therein, wherein the second electrode has a lower surface that is substantially parallel to the first plane, wherein the second electrode and the first electrode are spaced a distance apart in a second direction that is parallel to the first plane. The ground plate is electrically coupled to a ground reference, and comprises a first ground plate feature that extends between a surface of the ground plate and an upper surface of the first electrode, wherein the first ground plate feature surrounds at least a portion of a gas distribution pipe that is configured to deliver a fluid to the first gas delivery opening; and a second ground plate feature that extends between the surface of the ground plate and an upper surface of the second electrode, wherein the second ground plate feature surrounds at least a portion of a gas distribution pipe that is configured to deliver a fluid to the second gas delivery opening. The first RF delivery feature includes a feature wall that surrounds a portion of the first ground plate feature. The second RF delivery feature includes a feature wall that surrounds a portion of the second ground plate feature.

BRIEF DESCRIPTION OF THE DRAWINGS

So that the manner in which the above recited features of the present disclosure can be better understood in detail, a more particular description of the disclosure, briefly summarized herein, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
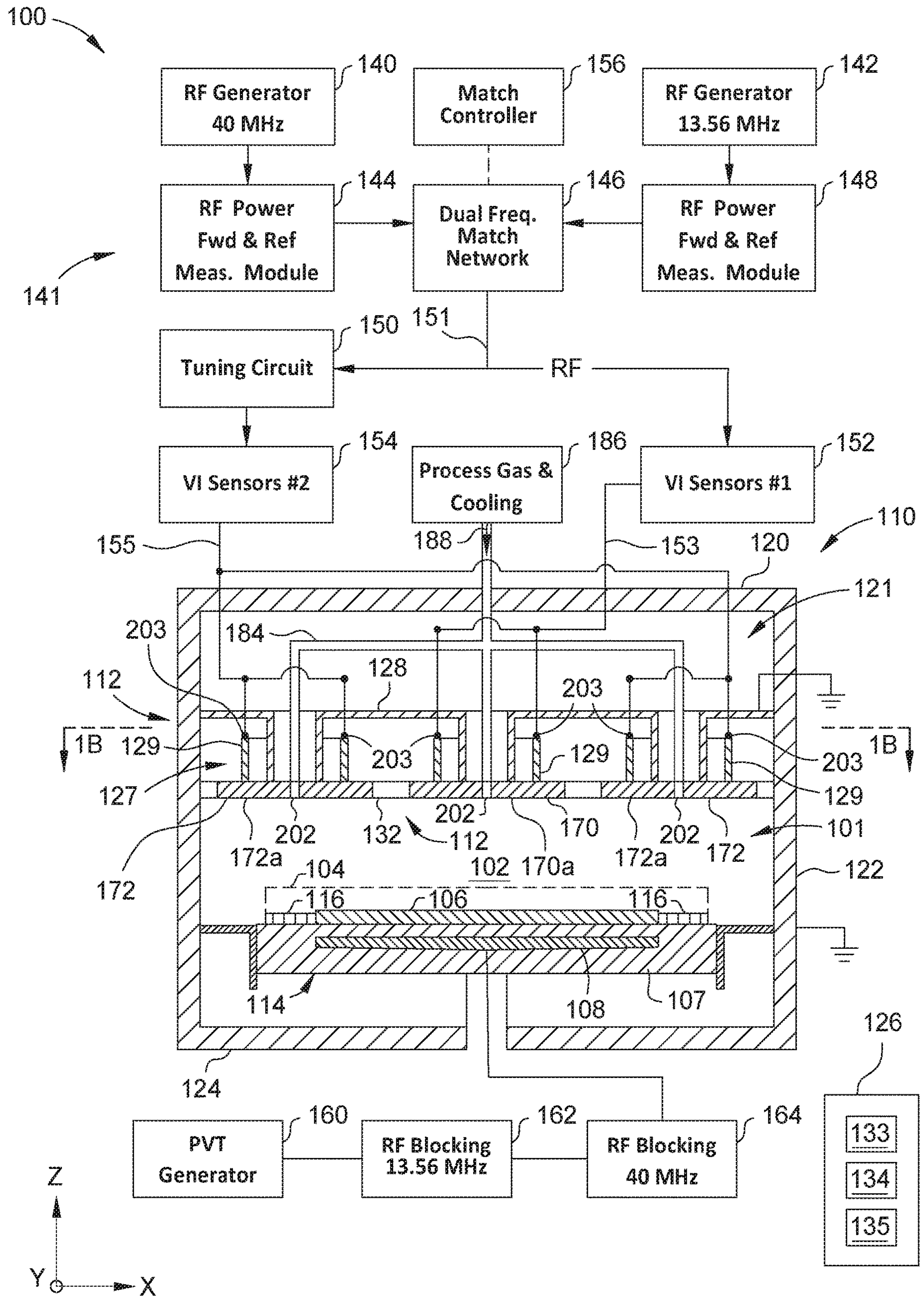
FIG. 1A illustrates a schematic side cross-sectional view of a plasma processing chamber and a block diagram of supporting electrical circuits of a plasma processing system, according to one or more embodiments of this disclosure.

Embodiments of the present disclosure generally relate to apparatus and methods for controlling the uniformity of a plasma formed using a radio frequency (RF) source power assembly that includes one or more tuning circuits coupled to two or more electrodes disposed within a multi-electrode source assembly. Embodiments of the disclosure can improve plasma uniformity control and also reduce system cost by eliminating the need for multiple RF generators and matches that power the multiple electrodes separately. Multiple frequencies may also be provided to multiple electrodes at the same time, which can provide another cost savings when using a multi-frequency RF source assembly.

Embodiments of the disclosure can provide a tuning knob(s) that is used for global plasma uniformity and feature tilt control. Whereby adjustments of the tuning knobs control the local plasma density over a surface of a substrate by controlling the RF power provided to segmented electrodes disposed within the processing region of a plasma processing chamber. The ion flux and direction, as well as energetic electron flux towards the substrate, are thus controlled to address the plasma non-uniformity and global tilt during processing of a semiconductor substrate (i.e., wafer).

In some embodiments, the RF voltage, current and phase sensor data obtained from each RF power providing output of a RF source power assembly that is coupled to a segmented electrode during a plasma process may be used for learning purposes and recorded. Thereby, based on the collected sensor data, the impedance characteristics of one or more tuning circuits within the source power assembly can be adjusted to better control one or more characteristics of the plasma formed within the plasma processing chamber.

In some embodiments, process control algorithm settings, e.g., resonant tuning circuit setting positions and RF power process levels and waveform characteristics, may be stored in a memory and subsequently used and/or enhanced for subsequent plasma manufacturing processes. Thus, well established and consistent manufacturing processes may be performed without the necessity of sensor monitoring of the manufacturing processes. This is especially advantageous for a large number of chamber plasma processes occurring during a semiconductor device manufacturing day. The same tuning recipe need not be applied to all of the plasma processing systems at the same time, and may be modified with different process control algorithms depending upon the intended semiconductor manufacturing process required. Different plasma processing tuning recipes may be distributed among the manufacturing plasma chamber systems depending upon the manufacturing requirements for different semiconductor products.

As will be discussed further below, operational information, e.g., RF sensor values and tuning circuit element positions, may be evaluated during a semiconductor manufacturing process. The operational process information may be recorded (stored in a memory) for subsequent evaluation and possible refinement for performing future manufacturing processes. For example, the plasma chamber condition can change over time, and different or modified RF tuning circuit algorithms may be implemented with the sum running time to reduce variations. Similarly configured plasma processing chambers may have slight differences which may cause undesirable process non-uniformity and global tilt during processing of a semiconductor substrate. These process result variations may be corrected by adjustments made by a tuning circuit algorithm that is running on a system controller. Different and adapted tuning circuit algorithms may also be used to reduce chamber-to-chamber variations. Different tuning circuit algorithms may be selected for different process steps when creating a chamber plasma processing recipe.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic side cross-sectional view of a plasma processing chamber and a block diagram of supporting electrical circuits of a plasma processing system, according to one or more embodiments of this disclosure. The plasma processing system, generally represented by the numeral 100, includes a plasma processing chamber 110 having a top 120, walls 122 and a bottom 124. In the plasma processing chamber 110 is a substrate support assembly 114 comprising a dielectric material 107 having an embedded electrode 108, e.g., electrostatic chuck (ESC) biasing electrode, an edge ring 116, and adapted to support a semiconductor substrate 106 during a plasma process applied thereto. The substrate support assembly 114 is positioned between the chamber bottom 124 and an RF electrode assembly 112. The volume between the substrate support assembly 114 and the RF electrode assembly 112 provides containment for a plasma 102 upon RF excitation thereto. A plasma sheath 104 is also formed over the top of the substrate support assembly 114, ring electrode 116 and the semiconductor substrate 106 during plasma processing.

An RF source power assembly 141 for exciting the process gas into a plasma may comprise a first RF generator 142, a second RF generator 140, RF power measurement modules 144 and 148, a dual frequency RF impedance matching network 146, a match controller 156, a tuning circuit 150, and RF voltage and current sensors 152 and 154. The RF generators 140 and 142 may be adapted to provide RF power at frequencies from about 100 kHz to about 200 MHz. RF power output from the RF power generators 140 and 142 may be from about 100 to about 10,000 Watts (W). The RF power may also be pulsed on and off at a pulse rate of from about one Hertz (Hz) to about 400 kHz, with an on/off duty cycle from about five (5) percent to about 95 percent. The tuning circuit 150 may be part of or separate from the RF impedance matching network 146.

Figure 1B:
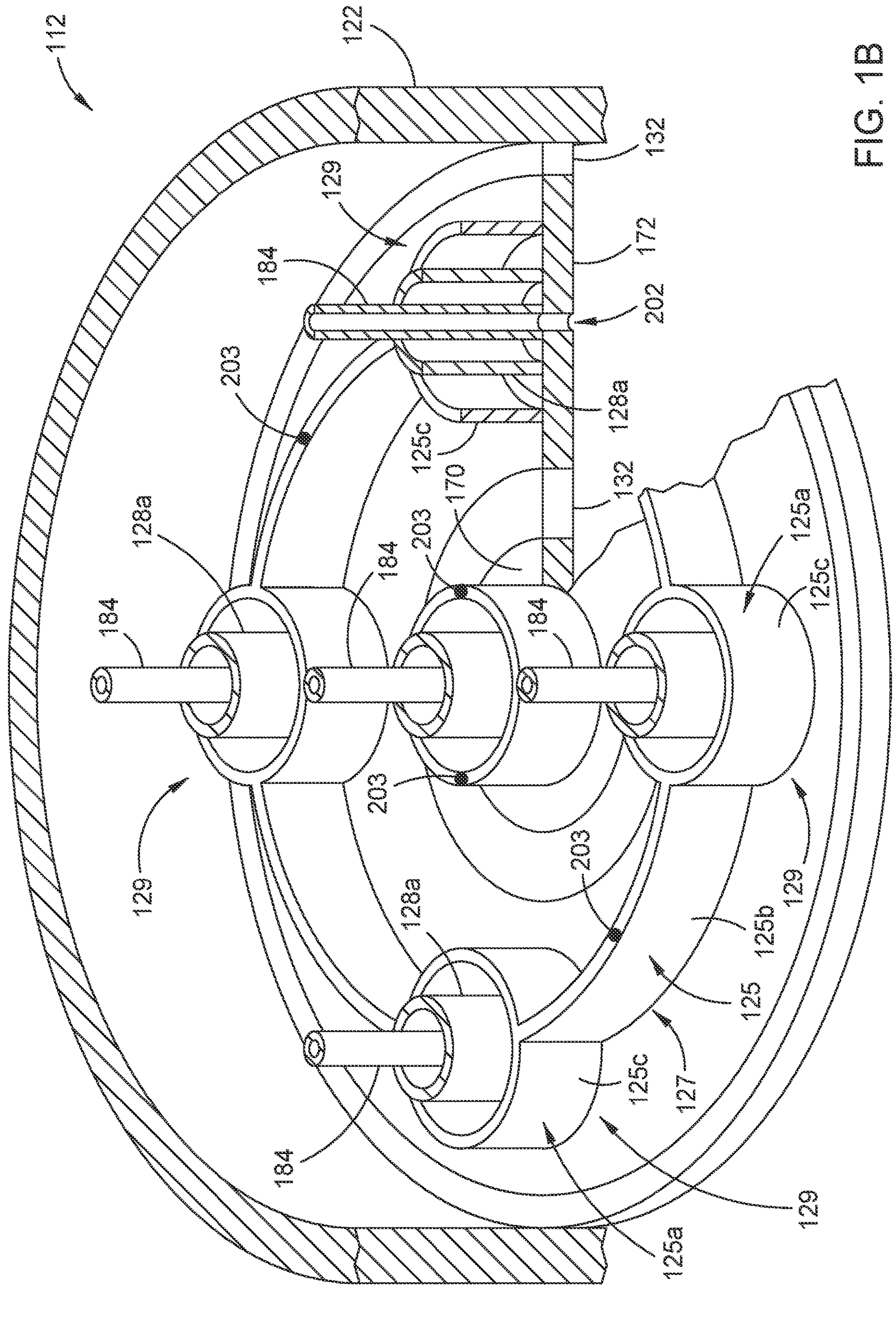
FIG. 1B is a schematic side isometric partial cross-sectional view of a first example of an RF electrode assembly of the plasma processing chamber illustrated in FIG. 1A, according to one or more embodiments of this disclosure.
Figure 1C:
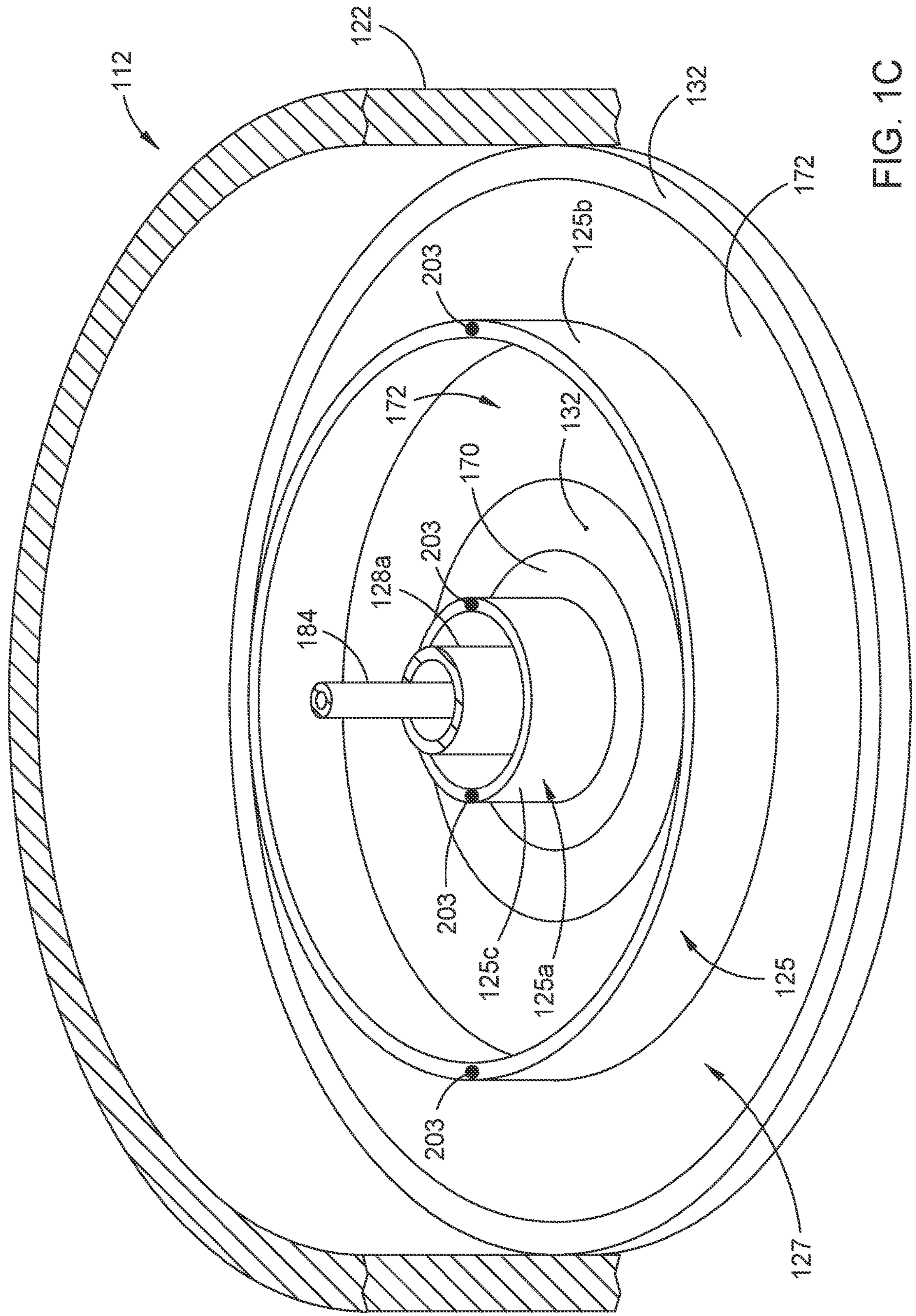
FIG. 1C is a schematic side isometric partial cross-sectional view of a second example of an RF electrode assembly, according to one or more embodiments of this disclosure.

The RF electrode assembly 112 will generally include an electrically (RF) non-conductive plate 132 having a plurality of electrodes coupled thereto, and positioned on the bottom thereof. The plurality of electrodes are each positioned to face a substrate supporting surface (i.e., top surface) of the substrate support assembly 114. In one example, as shown in FIGS. 1A-1C, the plurality of electrodes include an outer electrode 172 and an inner electrode 170. The outer electrode 172 and/or inner electrode 170 are positioned over at least a portion of the substrate supporting surface of the substrate support assembly 114, and are spaced a first distance from the substrate supporting surface in a first direction (e.g., Z-direction) that is perpendicular to the lower surfaces **170*a*, 172*a* of the inner electrode 170 and/or outer electrode 172, which at least partially define a portion of the processing region 101 of the plasma processing chamber 110. A ground plate (RF shield) 128 is mounted over the top of the non-conductive plate 132 and is electrically coupled to the grounded walls 122 of the plasma chamber 110. One or more process gases 188 are distributed from a process gas source 186 through the gas distribution piping 184 to the openings 202 that are formed in the non-conductive plate 132, the inner electrode 170 and/or the outer electrode 172 so that the process gases are distributed into the processing region between the RF electrode assembly 112 and the substrate support assembly 114 so that a uniform or shaped process plasma 102 can be formed therein. In some embodiments, the gas source 186 includes a plurality of mass flow controllers (MFCs) or other similar flow control devices that are each configured to separately control the flow rate of the one or more process gases through the individual gas distribution piping 184 and through the openings 202 to achieve a desired gas flow in each region of the process chamber during processing. In general, an RF electrode region 121, which is positioned above the non-conductive plate 132 and electrodes (e.g., inner electrode 170 and outer electrode 172), is maintained at an atmospheric pressure and the processing region 101 positioned below the non-conductive plate 132** and electrodes is maintained at a vacuum pressure during processing.

As is discussed further below, the RF electrode assembly 112 includes an RF delivery assembly 127 that includes at least one of an RF delivery structure 125 (FIGS. 1B-1C), RF gas delivery assemblies 129, and a plurality of RF connection assemblies 203. The RF connection assemblies 203 include RF delivery components that are configured to connect the outputs 153 and 155 of the RF source power assembly 141 to one or more connection points formed on the elements disposed within the RF delivery structure 125 and/or directly to a connection point formed on an electrode within the RF electrode assembly 112, such as the inner electrode 170 and/or the outer electrode 172 illustrated in FIGS. 1A-1C. The RF connection assemblies 203 may include: (a) a coaxial transmission line, which may include a flexible coaxial cable that is connected in series with a rigid coaxial transmission line, (b) hookup wire, (c) a metal rod, (d) an electrical connector, or (e) any combination of electrical elements in (a)-(d) that can be electrically connected to a connection point formed on a portion of the RF delivery structure 125 or an electrode. As schematically illustrated in FIG. 1A, a plurality of RF connection assemblies 203 are configured to deliver RF power provided from the output 153 to a plurality of connection points on a centrally located portion of the RF delivery structure 125 that is positioned within an RF gas delivery assembly 129 that is connected to the inner electrode 170, and a plurality of RF connection assemblies 203 that are configured to deliver RF power provided from the output 155 to a plurality of connection points formed on portions of the RF delivery structure 125 that is positioned within RF gas delivery assemblies 129 that are positioned on opposing sides of the outer electrode 172.

FIG. 1B is a side isometric partial cross-sectional view of an example of an RF electrode assembly 112. The side isometric partial cross-sectional view has been formed by use of the section line 1B-1B illustrated in FIG. 1A. As shown in FIG. 1B, the RF electrode assembly 112 includes an inner electrode 170 and an outer electrode 172 that are concentrically arranged and separated by portions of the non-conductive plate 132 that are all positioned on an interior side of the chamber wall 122. In some embodiments, the RF electrode assembly 112 also includes one or more RF gas delivery assemblies 129. In one example, the RF electrode assembly 112 includes an RF gas delivery assembly 129 that is formed at a central portion of the inner electrode 170, and four RF gas delivery assemblies 129 that are each formed along a circular diameter that is centered about a central axis of the outer electrode 172. The four RF gas delivery assemblies 129 formed on the outer electrode 172 are formed in an array in which the RF gas delivery assemblies 129 are equally spaced along the circular diameter. Each RF gas delivery assembly 129 includes a portion of the gas distribution piping 184, a ground plate feature **128*a* of the ground plate 128, and an RF delivery feature 125*a* of the RF delivery structure 125. The ground plate feature 128*a* illustrated in FIGS. 1B and 1C are partial protruding portions of the ground plate 128. In some embodiments, the ground plate feature 128*a* of the ground plate 128 is concentrically positioned around the portion of the gas distribution piping 184, and the RF delivery feature wall 125*c* of the RF delivery feature 125*a* of the RF delivery structure 125 is concentrically positioned around the portion of the ground plate feature 128*a* of the ground plate 128. In some embodiments, as shown in FIG. 1B, the RF delivery structure 125 also includes RF current distribution elements 125*b* that each extend between a pair of adjacent RF delivery features 125*a* of the RF delivery structure 125, and are used to evenly distribute or balance out the delivery of RF power to the RF delivery features 125*a* of the RF delivery structure 125 and electrode that they are formed on. The RF delivery structure 125 components, which include the RF delivery features 125*a* and/or RF current distribution elements 125*b*, can be formed as part of an electrode or electrically connected to an electrode (e.g., brazed, welded, etc.), such as the inner electrode 170 or the outer electrode 172. In some embodiments, the ground plate feature 128*a* of the ground plate 128 is in contact with or coupled to a surface of an electrode, such as the inner electrode 170 or the outer electrode 172. Similarly, in some embodiments, the portion of the gas distribution piping 184 is in contact with or coupled to a surface of an electrode, such as the inner electrode 170 or the outer electrode 172**.

During operation, the RF power that is delivered to the RF connection assemblies 203 from the outputs 153, 155 of the RF source power assembly 141 is distributed evenly to an electrode through the portions of the RF delivery structure 125. The RF power that is delivered to the RF connection assemblies 203 is isolated from the portion of the gas distribution piping 184 by the ground plate feature **128*a* of the ground plate 128**, which thus prevents arcing during operation.

FIG. 1C is a side isometric partial cross-sectional view of an additional example of an RF electrode assembly 112. The side isometric partial cross-sectional view is intended to illustrate an alternate structure of an RF electrode assembly 112 that had been similarly formed by use of the section line 1B-1B through the alternate example of an RF electrode assembly 112 that is shown in FIG. 1A. As shown in FIG. 1C, the RF electrode assembly 112 includes an inner electrode 170 and an outer electrode 172 that are concentrically arranged and separated by portions of the non-conductive plate 132 that are all positioned on an interior side of the chamber wall 122. In one embodiment, the RF electrode assembly 112 also includes an RF gas delivery assembly 129 and an RF current distribution element **125*b*. In this example, the RF electrode assembly 112 includes an RF gas delivery assembly 129 that is formed at a central portion of the inner electrode 170, and an RF current distribution elements 125*b* that is formed along a circular diameter that is centered about a central axis of the outer electrode 172. In this example, the RF gas delivery assembly 129 is configured to deliver one or more process gases 188 to the center of the inner electrode 170 and center of the processing region 101 during processing. The RF current distribution element(s) 125***b* formed on the outer electrode 172 are formed in a circular configuration. A plurality of RF connection assemblies 203 are configured to deliver RF power provided from the output 153 to a plurality of connection points on the centrally located portion of the RF delivery structure 125 of the RF gas delivery assembly 129 connected to the inner electrode 170, and a plurality of RF connection assemblies 203 are configured to deliver RF power provided from the output 155 to a plurality of connection points formed on the portions of the RF current distribution elements 125*b* of the RF delivery structure 125 that is positioned on the outer electrode 172. The RF current distribution element elements 125*b* is used to evenly distribute or balance out the delivery of RF power to points along the RF current distribution elements 125*b* and to the outer electrode 172 during the delivering of RF power to the outer electrode 172. Similarly, the RF delivery feature 125*a* of the RF delivery structure 125 is used to evenly distribute or balance out the delivery of RF power to points along the RF delivery feature 125*a* and to the inner electrode 170 during the delivering of RF power to the inner electrode 170.

The output of a DC pulse generator (PVT) 160 may be coupled to the embedded electrode 108 in the substrate support assembly 114. The embedded electrode 108 can be an electrostatic chucking electrode that is disposed within an electrostatic chuck within the substrate support assembly 114. RF blocking filters 162 and 164 may be coupled between the DC pulse generator 160 and the embedded electrode 108, and may be used to substantially block RF energy from getting into the DC pulse generator 160. In general, the pulsed voltage (PV) waveforms established at the embedded electrode 108, such as either the negative pulse waveforms, shaped pulse waveforms or positive pulse waveforms, include a periodic series of pulse voltage (PV) waveforms repeating with a period TPD, on top of a voltage offset ($\Delta V$). In one example, the period TPD of the PV waveforms can be between about 1 us and about 5 μs, such as about 2.5 μs, e.g., between about 200 kHz and about 1 MHZ, or about 400 kHz, such as about 1 MHz or less, or about 500 KHz or less. The DC pulse generator 160 may be adapted to deliver asymmetric DC pulses to the embedded electrode 108 for control of the plasma sheath 104 formed over the surface of the semiconductor substrate 106. In some embodiments, the plasma processing chamber 110 may be configured for plasma-assisted etching processes, such as a reactive ion etch (RIE) plasma processing. The plasma processing chamber 110 may also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing.

A system controller 126, also referred to herein as a processing chamber controller, includes a central processing unit (CPU) 133, a memory 134, and support circuits 135. The system controller 126 is used to control the process sequence used to process the substrate 106, including the electrode and substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing chamber 110 and plasma processing system 100.

Typically, the program stored in memory 134, which is readable by CPU 133 in the system controller 126, includes code which, when executed by the processor (CPU 133), performs tasks relating to the plasma processing schemes described herein. The program may include instructions that are used to control the various hardware and electrical components within the processing chamber 110 to perform the various process tasks and various process sequences used to implement the methods described herein. In one embodiment, the program includes instructions that are used to perform one or more of the operations described below in relation to FIGS. 10A-11B and 14.

Figure 2B:
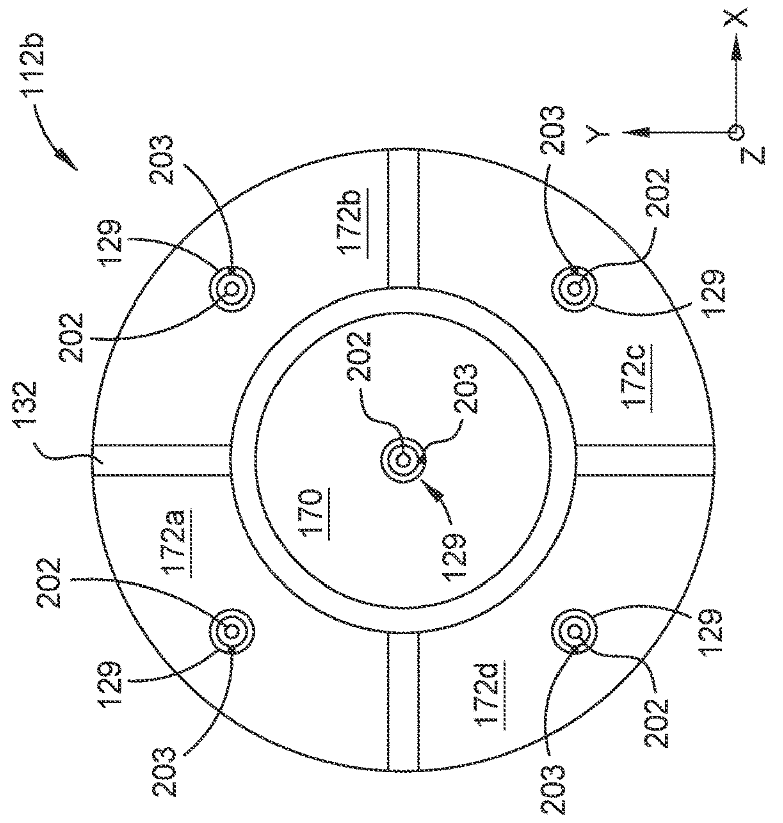
FIGS. 2A, 2B, 3A and 3B illustrate schematic plan views of different RF configurations of multi-electrode source assemblies, according to one or more embodiments of this disclosure.
Figure 2A:
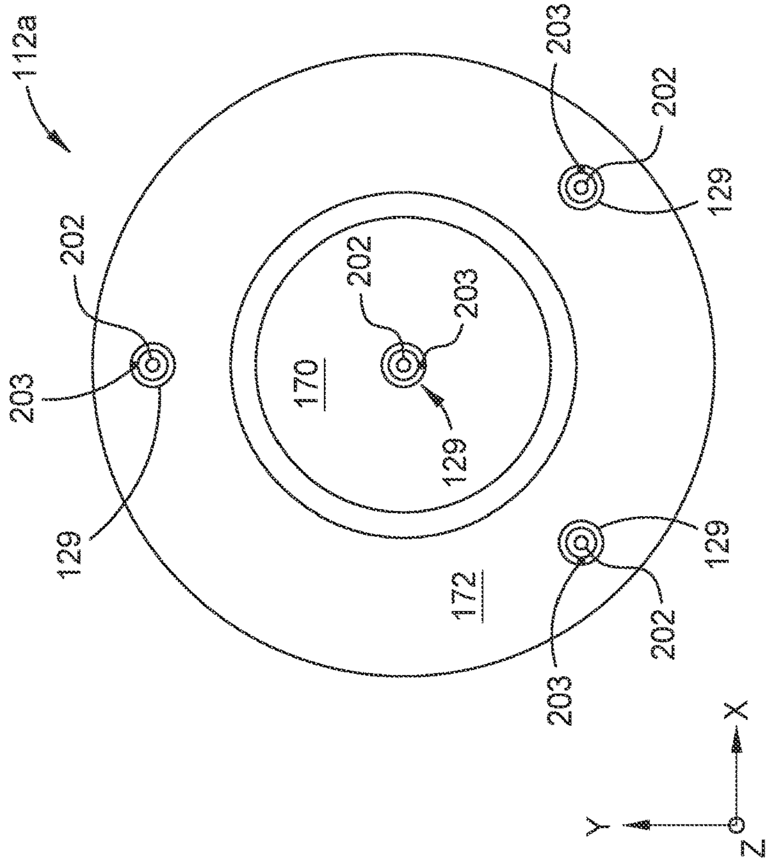

Referring to FIGS. 2A, 2B, 3A and 3B, depicted are schematic plan views of different configurations of multi-electrode source assemblies, which are also referred to herein as RF electrode assemblies 112, according to one or more embodiments of this disclosure. The multi-electrode source assemblies will generally include two or more electrodes that each include a major surface (e.g., lower surface) that is substantially parallel to a substrate supporting surface (e.g., top surface) of the substrate support assembly 114 (FIG. 1). FIG. 2A illustrates an RF electrode assembly 112*a* comprising two concentric electrodes, an inner electrode 170 and an outer electrode 172 surrounding the inner electrode 170. When not coupled to the RF source power assembly 141, the electrodes 170 and 172 are electrically isolated from each other, and face the substrate support assembly 114. FIG. 2B illustrates an RF electrode assembly 112*b* comprising an inner electrode 170 surrounded by a plurality of outer electrode segments 172*a*, 172*b*, 172*c* and 172*d*. The inner electrode 170 and outer electrode segments 172*a*, 172*b*, 172*c* and 172*d* are electrically isolated from each other, attached to the bottom of the RF insulator plate 132, and face the top of the substrate support assembly 114. As illustrated in FIGS. 2A and 2B, the electrodes and/or electrode segments shown therein can include a plurality of RF connection assemblies 203 and a plurality of RF gas delivery assemblies 129, which include the gas passages 202 that extend through the electrodes and/or electrode segments. As will be discussed further below, the RF connection assemblies 203 are connected to one or more outputs of the RF source power assembly 141, such as outputs 153 and 155 shown in FIG. 1. For simplicity of illustration and discussion reasons, the RF gas delivery assemblies 129 shown in FIGS. 2A-7 are schematically represented as three concentric circles, and are intended include the physical and electrical attributes found in the description of these structures provided above. As illustrated, the RF connection assemblies 203 can be symmetrically positioned within each of the RF delivery features 125*a* of the RF delivery structure 125 of the RF gas delivery assemblies 129 and/or electrodes or electrode segments to evenly distribute the RF power provided at one or more RF frequencies. The gas passages 202 found at the output end of each of the RF gas delivery assemblies 129, which are shown in FIGS. 2A-3B, are configured to deliver one or more process gases to their respective portions of the processing region 101. The concentric or coaxial relationship between the gas distribution piping 184, ground plate feature 128*a* of the ground plate 128, and RF delivery features 125*a* of the RF delivery structure 125 within each of the RF gas delivery assemblies 129 is configured to allow a gas and the RF power to be simultaneously provided to the same region of the electrode or electrode segment. The gas distribution piping 184 can include welded stainless steel (SST) tubing, such as $\frac{1}{8}$", $\frac{5}{16}$", $\frac{1}{4}$", or $\frac{3}{8}$" 304 or 316 SST tubing, for example.

In some embodiments, the gas passages 202 are configured to inhibit and/or prevent the transmission of an RF current within the gas passages 202 and gas distribution piping 184 during the delivery of RF power to an electrode at frequencies between 100 KHz and 200 MHz, such as frequencies between 2 MHz and 60 MHz during processing. In one configuration, the gas passages 202 include through holes that have an inner diameter that is between about 50 μm and 5 mm, such as between about 50 μm and 3 mm, and a length that is between about 5 mm and 50 mm. In another configuration, each of the gas passages 202 comprises an array of holes formed in a cover plate within a gas passage outlet region that is positioned at an outlet end of the gas passage 202 (e.g., local region of the lower surface of the electrode) to form a showerhead like configuration, and, in some configurations, a single diameter hole at an inlet end of the gas passage 202 (e.g., upper surface of the electrode), wherein the inlet end is spaced a distance of 5 mm to 50 mm from outlet end. In one example, the array of holes, which are positioned within the gas passage outlet region at the outlet end of a gas passage 202, are arranged in a circular or rectangular array that includes two or more holes that are formed in the cover plate within the gas passage outlet region and are between 50 μm and 1 mm in size. The single diameter hole at the inlet end of the gas passage can be between about 0.5 mm and 5 mm in size. The gas passage outlet region can include a region that is the same size as the hole formed at the inlet end of the gas passage, or be two to five times larger in size than the hole formed at the inlet end of the gas passage 202. In some embodiments, one or more of the electrodes includes an array of gas passage outlet regions that are positioned across the lower surface of the electrode. In one example, the array of gas passage outlet regions are similarly arranged in an array as the gas passages 202 shown in FIGS. 1B-7.

Figure 3B:
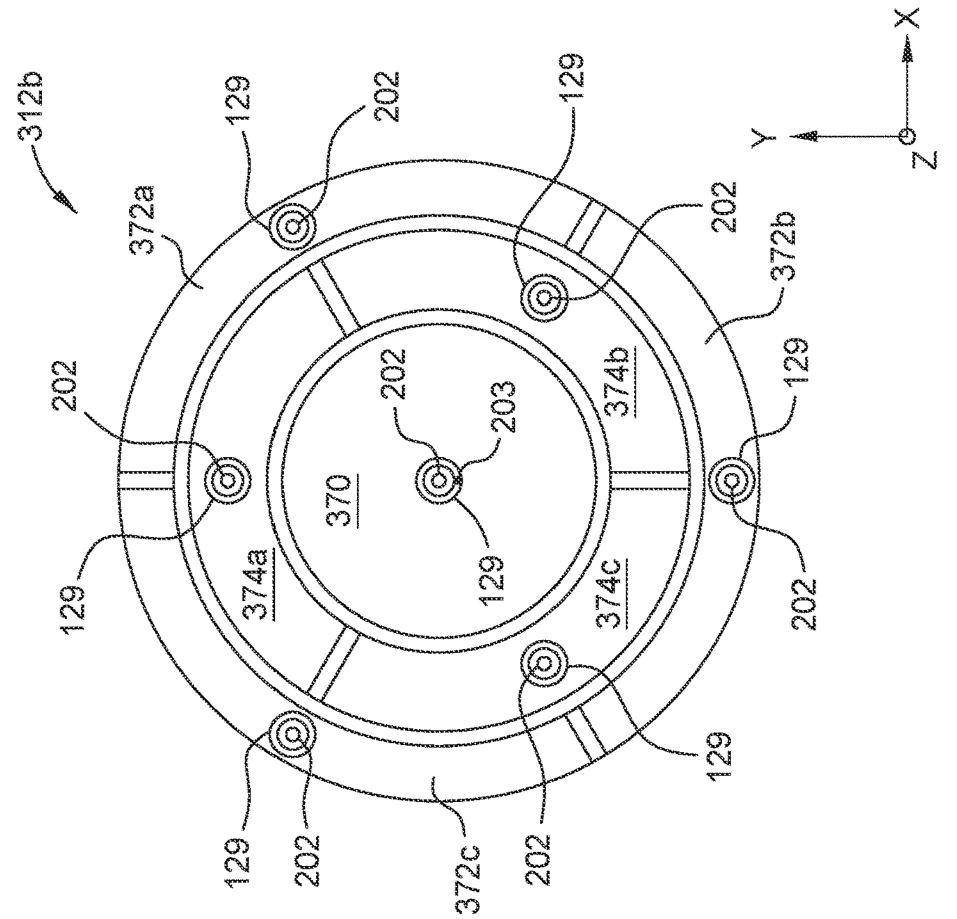
Figure 3A:
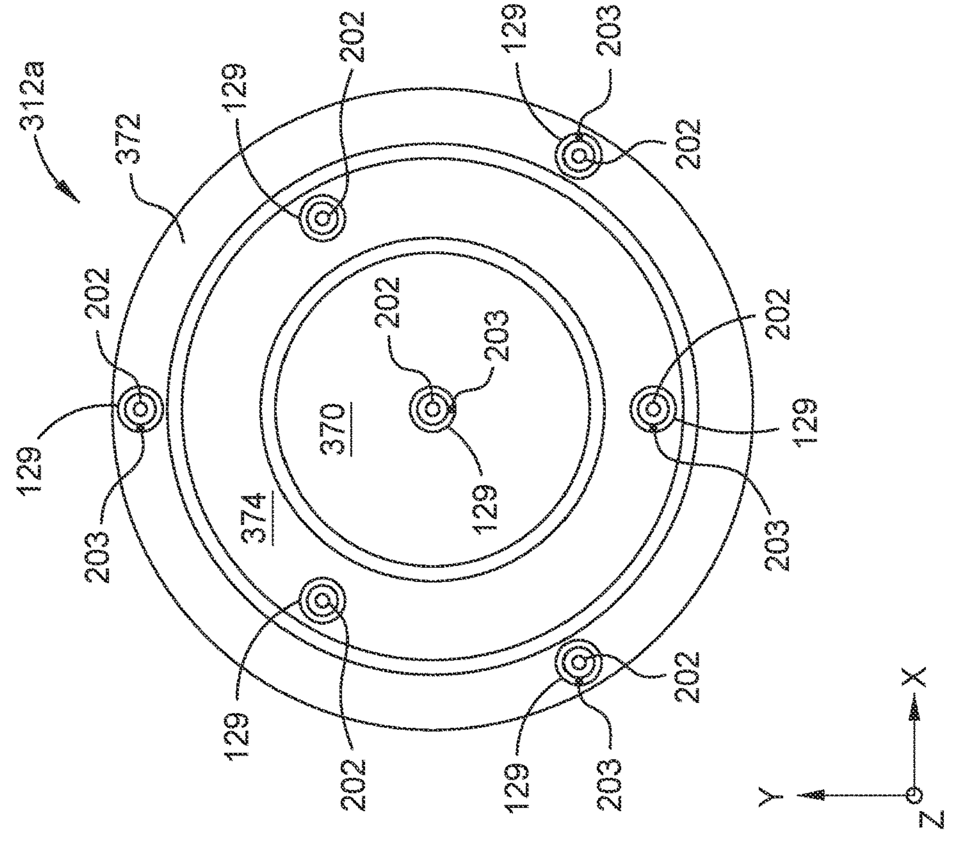

FIG. 3A illustrates an RF electrode assembly 312*a* comprising three concentric electrodes, an inner electrode 370, a middle electrode 374 surrounding the inner electrode 370, and an outer electrode 372 surrounding the middle electrode 374. In one example, as shown in FIG. 3A, the middle electrode 374 circumscribes the inner electrode 370 and the outer electrode circumscribes the middle electrode 372 and the inner electrode 370. The electrodes 370, 374 and 372 are electrically isolated from each other, attached to the bottom of the RF insulator plate 132, and face the substrate support assembly 114. FIG. 3B illustrates an RF electrode assembly 312*b* comprising an inner electrode 370 surrounded by a plurality of middle electrode segments 374*a*, 374*b*, 374*c* and 374*d*, and the plurality of middle electrode segments 374*a*, 374*b*, 374*c* and 374*d* are surrounded by a plurality of outer electrode segments 372*a*, 372*b*, 372*c* and 372*d*. The inner electrode 370, middle electrode segments 372*a*, 372*b*, 372*c* and 372*d*, and the outer electrode segments 372*a*, 372*b*, 372*c* and 372*d* are electrically isolated from each other, attached to the bottom of the RF insulator plate 132, and face the top of the substrate support assembly 114. The process gas passages 202 found at the output end of each of the RF gas delivery assemblies 129 are configured to deliver one or more process gases to their respective portion of the processing region 101. As similarly discussed above and illustrated in FIGS. 3A and 3B, the RF delivery features 125*a* of the RF delivery structure 125 of the RF gas delivery assemblies 129 and/or electrodes and/or electrode segments shown therein can include a plurality of RF connection assemblies 203 that are arranged in a desired configuration and/or pattern to promote improved plasma processing results.

FIGS. 4, 5, 6 and 7 illustrate schematic plan views of RF electrodes and schematic block diagrams of respective RF tuning circuits and associated RF support circuits coupled to the RF electrodes at an RF connection assembly 203, according to one or more embodiments of this disclosure. For simplicity of illustration and discussion below, each of the electrical connections in FIGS. 4-7 are illustrated as being a single connection point. However, the illustrated schematic configuration is not intended to limit the scope of the disclosure provided herein since the number and position of each of the RF connection points can be adjusted to provide an improved distribution of RF power from an electrode to the plasma, and thus in some cases compensate for RF wavelength to electrode size effects commonly found when using higher RF frequencies and/or larger electrode sizes. In some examples, the RF connection points are distributed evenly and/or symmetrically around the RF delivery structure 125 elements and/or electrode surfaces to improve the uniform distribution of the RF power. As discussed above, examples of such distributed RF connection configurations are provided in FIGS. 1A-3B.

Figure 4:
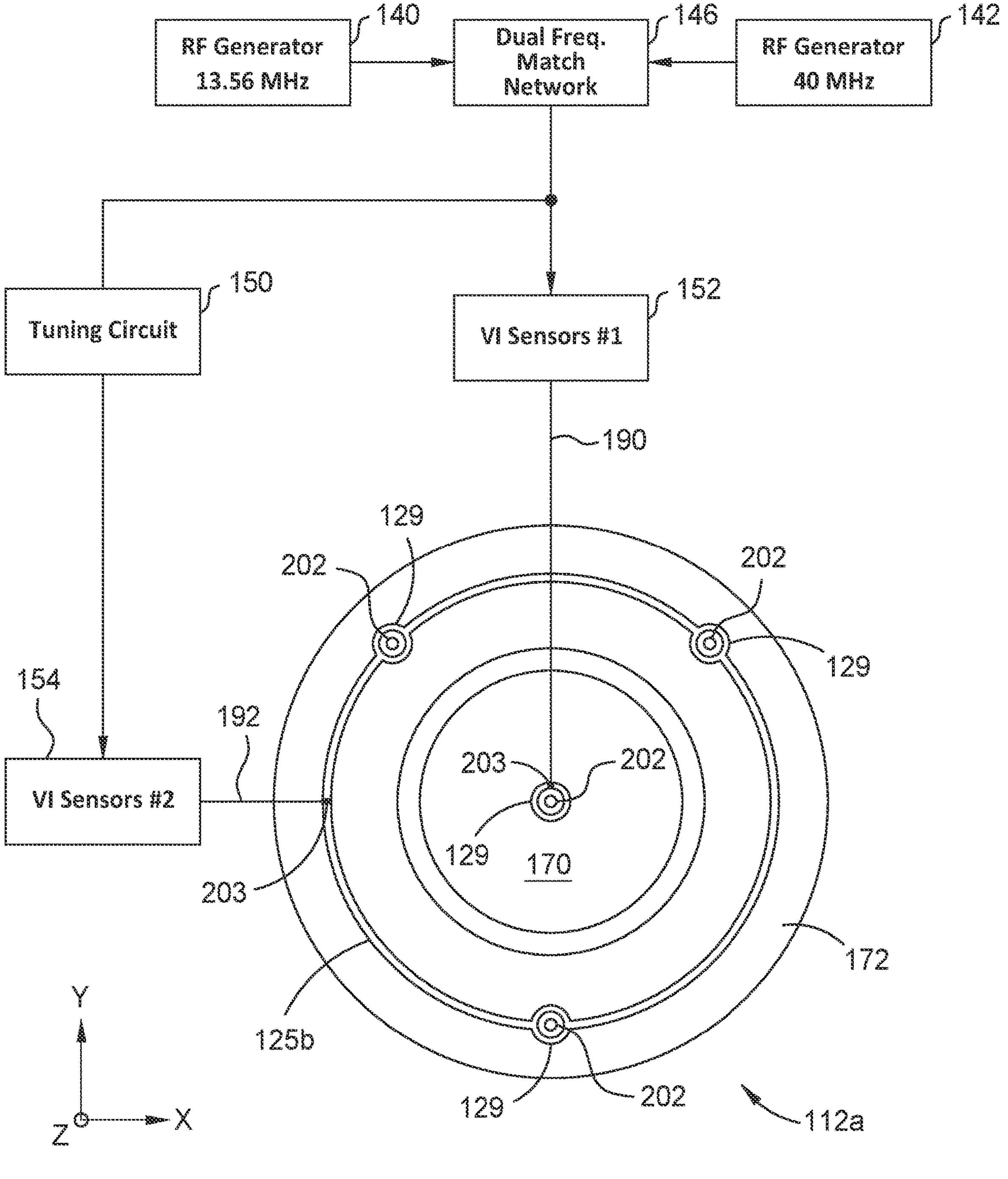
FIGS. 4, 5, 6 and 7 illustrate schematic plan views of RF electrodes and schematic block diagrams of respective RF tuning circuits and associated RF support circuits coupled to the RF electrodes, according to one or more embodiments of this disclosure.
Figure 5:
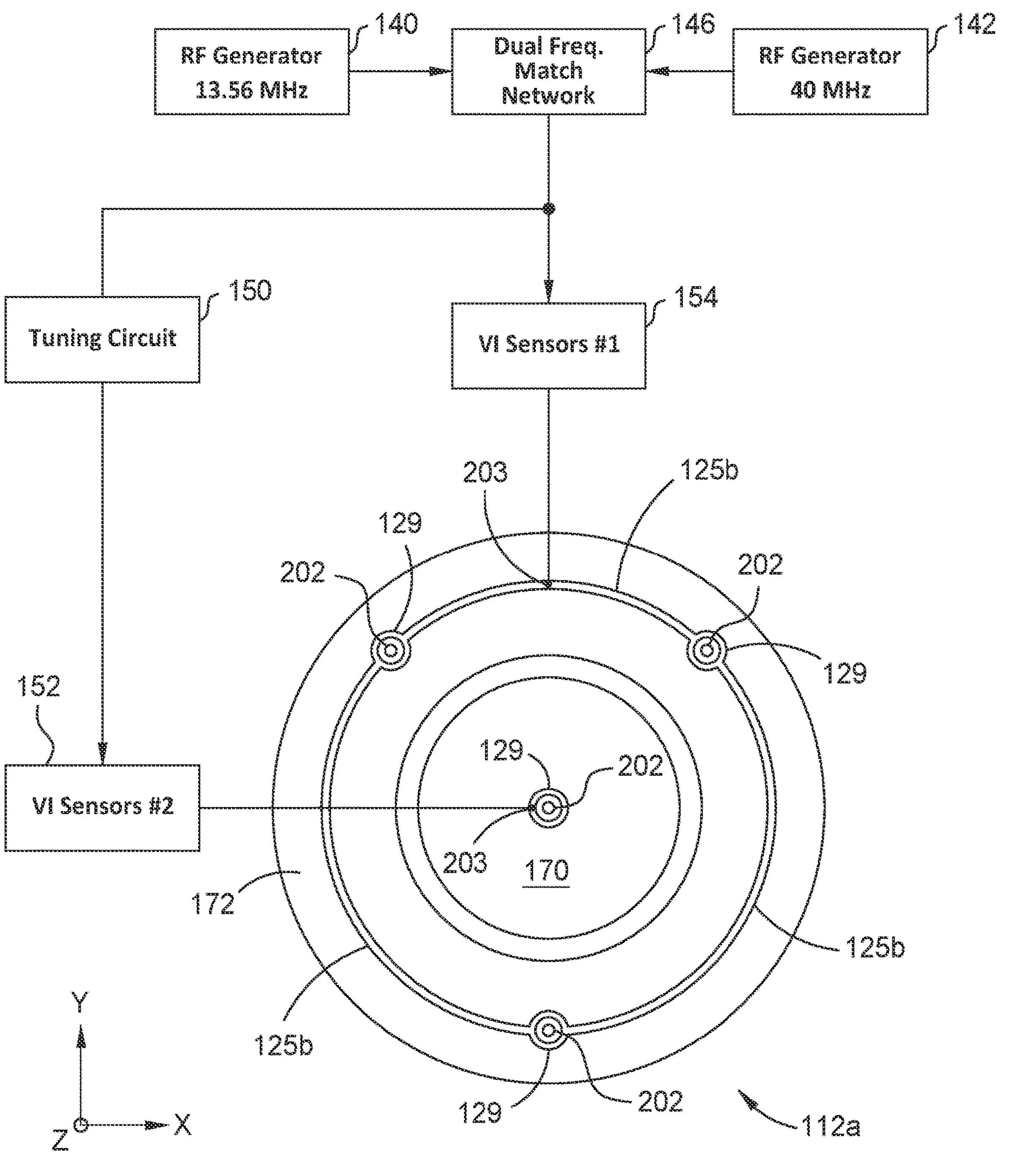
Figure 6:
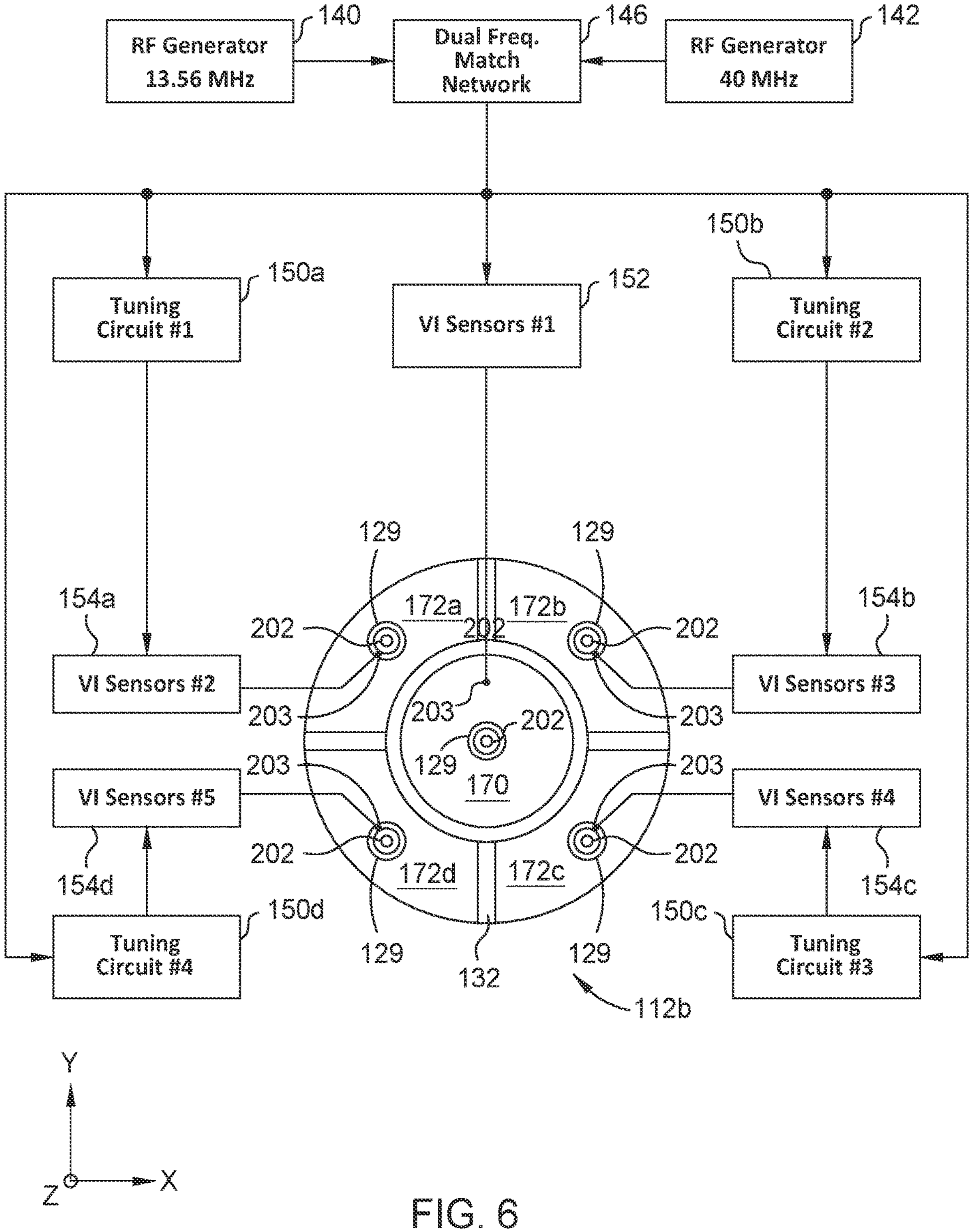
Figure 7:
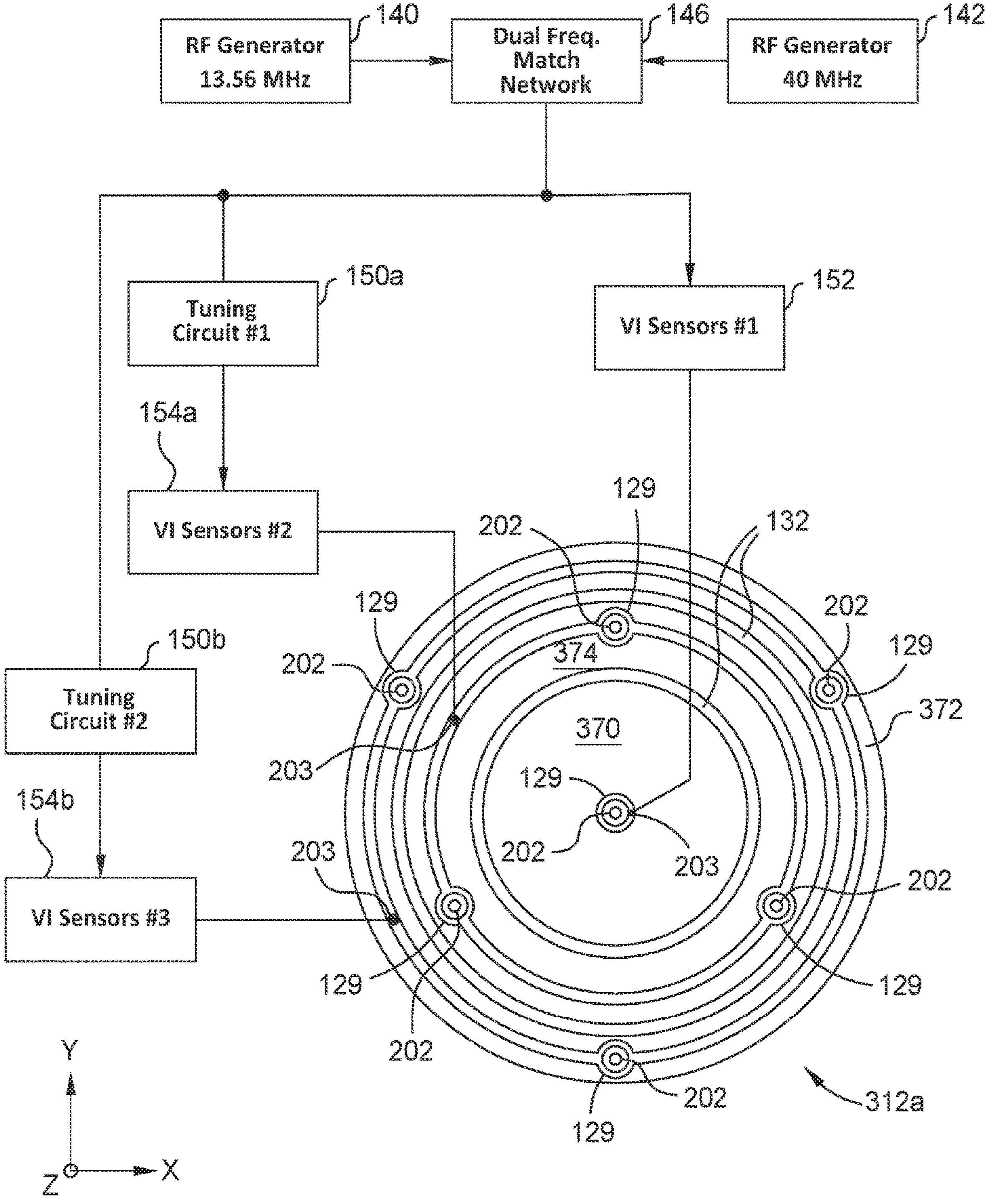

FIG. 4 illustrates the inner electrode 170 coupled to the output 151 of the match network 146 and the outer electrode 172 coupled to the tuning circuit 150, which is coupled between the output 151 of the match network 146 and the outer electrode 172. FIG. 5 illustrates the outer electrode 172 coupled to the match network 146 and the inner electrode 170 coupled to the tuning circuit 150, which is coupled between the output 151 of the match network 146 and the inner electrode 170. FIG. 6 illustrates the inner electrode 170 coupled to the match network 146 and the plurality of outer electrode segments 172*a*, 172*b*, 172*c* and 172*d* coupled to respective ones of a plurality of tuning circuits 150*a*, 150*b*, 150*c* and 150*d*, which are each coupled between the output 151 of the match network 146 and their respective electrode segment. FIG. 7 illustrates the inner electrode 370 coupled to the match network 146, a middle electrode 374 coupled to a tuning circuit 150*a*, and the outer electrode 372 coupled to a tuning circuit 150*b*, wherein each tuning circuit 150*a*, 150*b* is coupled between the output 151 of the match network 146 and their respective electrode. Other electrode configurations and symmetries are possible and are contemplated herein. One having ordinary skill in the radio frequency arts and with the teachings of this disclosure could design other combinations of electrodes and tuning circuits. Each electrode and electrode segment has RF voltage (V) and current (I) sensors 154 associated therewith. The VI sensors 154 measure V(t) and I(t), and from these VI measurements voltage and current amplitudes, and phase angle between V(t) and I(t) can be derived, as more fully described hereinafter.

Radio Frequency Impedance and Power Determination

Radio frequency (RF) impedance is determined by the RF voltage V(t), RF current I(t), phase angle θ and frequency of an RF waveform. RF voltage and current sensors measure the RF voltage V(t) and RF current (I(t), and phase angle θ is determined therefrom. Frequency is measured with a frequency detector. Phase angle is the lead or lag time between the RF voltage V(t) and RF current I(t) waveforms and is expressed in degrees θ. RF power P(t) is the product of voltage and current, or P(t)=V(t)*I(t), while the respective RMS (root-mean-square) values after sensor detection are P=V*I*cos θ, where θ is the phase angle between the voltage and current waveforms. Using Ohm's Law Z(t)=V (t)/I(t) or Z may be expressed as Z=R+jX, where R=Z cos θ and jX=Z sin θ. jX=jωL−j/ωC, where ω=2πf, f is in frequency, C is in farads and L is in henrys. R is resistance in ohms and jX is reactance in ohms, where +jX is inductive reactance and −jX is capacitive reactance. Power is frequency independent and impedance is frequency dependent.

Figure 8A:
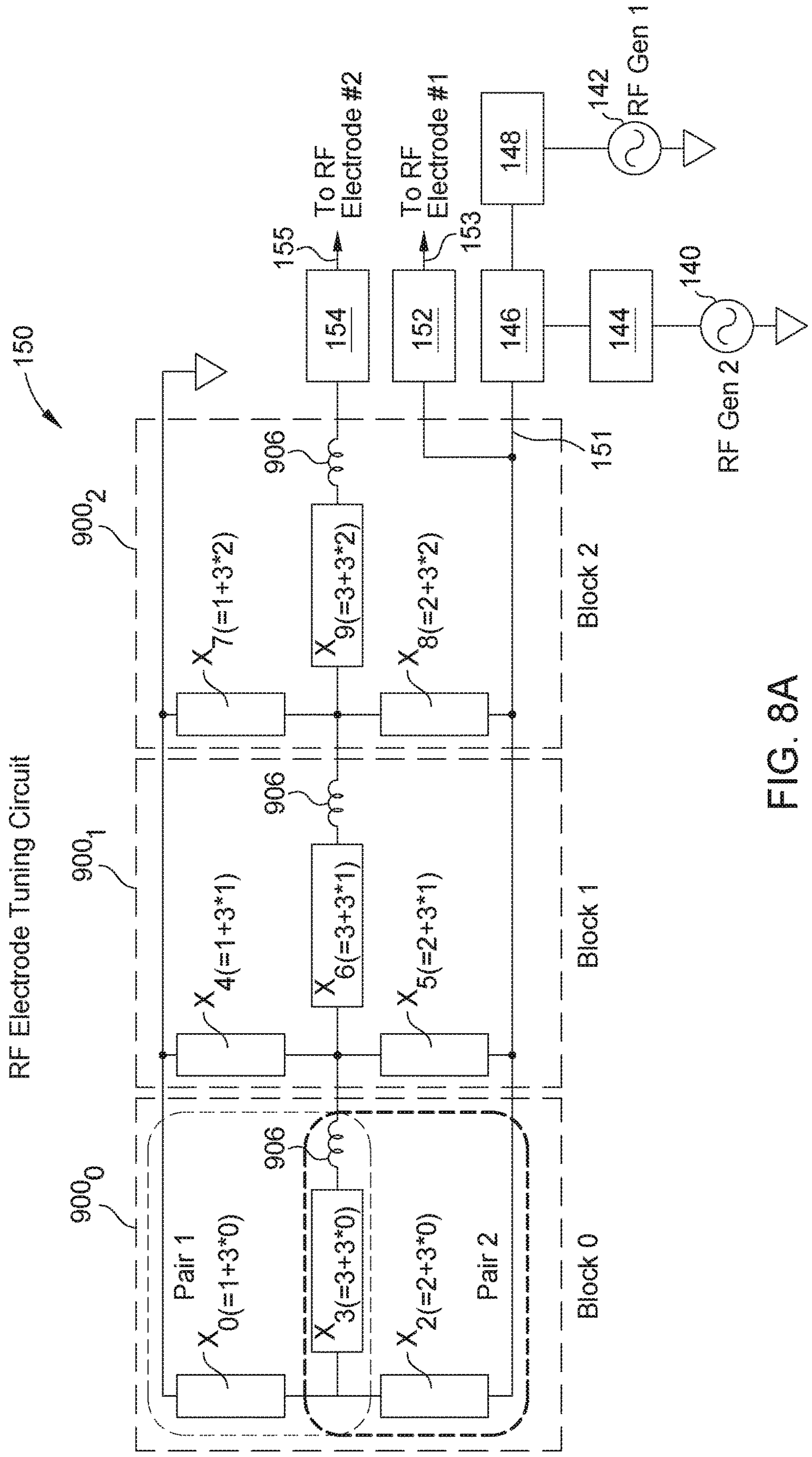
FIG. 8A illustrates a schematic block diagram of an RF tuning circuit, associated RF power generation, and matching and monitoring circuits, according to one or more embodiments of this disclosure.

FIG. 8A illustrates a schematic block diagram of an RF tuning circuit 150, associated RF power generators, and matching and monitoring circuits, according to one or more embodiments of this disclosure. FIGS. 9A, 9B, 9C and 9D illustrate schematic diagrams of inductor and variable capacitor components associated with the RF tuning circuit shown in FIG. 8A. The tuning circuit 150 topology of FIG. 8A can be configured to adjust the RF power characteristics provided to the electrodes provided within the plasma processing chamber 110. Referring to FIG. 4, in one example, RF amplitude and phase at a multiple number of RF frequencies (e.g., provided by the two or more RF power sources e.g., RF generators 140, 142, etc.) are coupled to and simultaneously controlled at the outer electrode 172 and the inner electrode 170. Additionally, in some embodiments, while the RF amplitude and phase are being adjusted at the outer electrode 172, an RF voltage at the RF electrode inner ring 170 may be maintained at the original values provided by the RF generators 140 and 142.

In at least some of the embodiments of FIG. 8A, the tuning circuit 150 can include multiple circuit blocks numbered 0, 1, 2, . . . and connected in parallel between ground and the dual frequency matching network 146. For illustrative purposes, the tuning circuit 150 is shown including three circuit blocks $900_0$, $900_1$ and $900_2$ (hereinafter simply referred to as circuit blocks 900*n*). In some embodiments, the middle legs of the circuit blocks 900*n* are connected through inductors 906 therebetween, which are connected between the output 151 of the impedance matching network 146 and the first output 155 of the tuning circuit 150 (e.g., an RF electrode 170, 172, 374), and a second output 153 is connected to the output 151 of the impedance matching network 146.

The circuit blocks 900*n* may include one or more electrical components, e.g., circuit block $900_0$ includes impedance producing elements $X_1$, $X_2$ and $X_3$, and an additional inductor (e.g., inductor 906) in the middle leg. The additional inductor 906 can be used to supplement an inductor that may be present in impedance producing element $X_3$. Each of the inductors 906 in the circuit blocks 900*n* may have the same inductance or different inductance values, depending on an inductance of inductors in the individual impedance producing elements of the circuit blocks 900*n*. Similarly, circuit blocks $900_1$ and $900_2$ include impedance producing elements $X_4$-$X_6$ and $X_7$-$X_9$, respectively. Each of the impedance producing elements $X_1$-$X_9$ may have, for example but are not limited to, four configurations, as shown in FIGS. 9A through 9D. For example, each of the impedance producing elements $X_1$-$X_9$ may include one or more of a variable capacitor 902 (see FIG. 9A), an inductor 904 (see FIG. 9B), a variable capacitor 902 and an inductor 904 in series (see FIG. 9C), and/or a variable capacitor 902 and an inductor 904 in parallel (see FIG. 9D). In at least some embodiments, the inductor 904 can be a variable inductor (not shown but contemplated herein). In at least some embodiments, the impedance producing elements $X_1$-$X_3$ of the circuit block 900*a* of the tuning circuit 150 may include one or more inductors 904 and one or more variable capacitors 902 (and/or one or more of the LC series and/or LC parallel circuits as shown in FIGS. 9A through 9D) in one or more pairs. In at least some embodiments, the variable capacitor 902 of (a) in FIG. 9 may be the same as or different from the variable capacitor 902 in (c) and/or (d). Similarly, the inductor 904 of FIG. 9B may be the same as or different from the inductor 904 in FIG. 9C and/or FIG. 9D. The position of the variable capacitor 902 may be controlled and monitored by a position control and monitoring circuit 910.

Figure 9A:
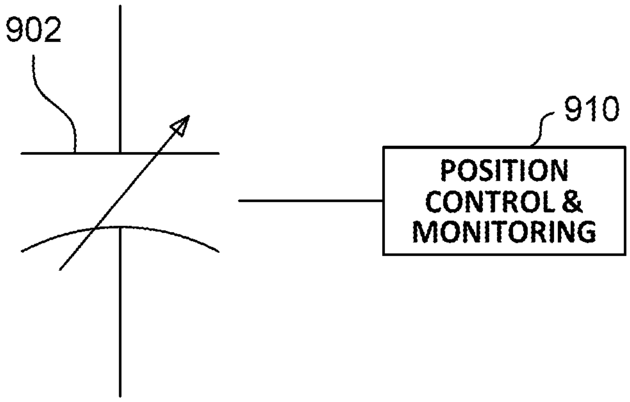
FIGS. 9A, 9B, 9C and 9D illustrate schematic diagrams of inductor and variable capacitor components associated with the RF tuning circuit shown in FIG. 8A.
Figure 9B:
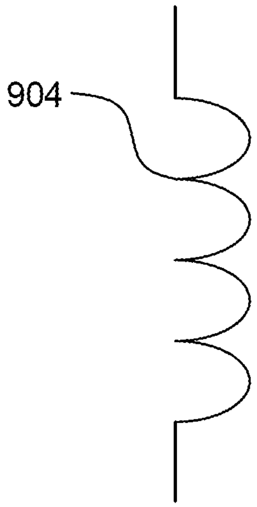
Figure 9D:
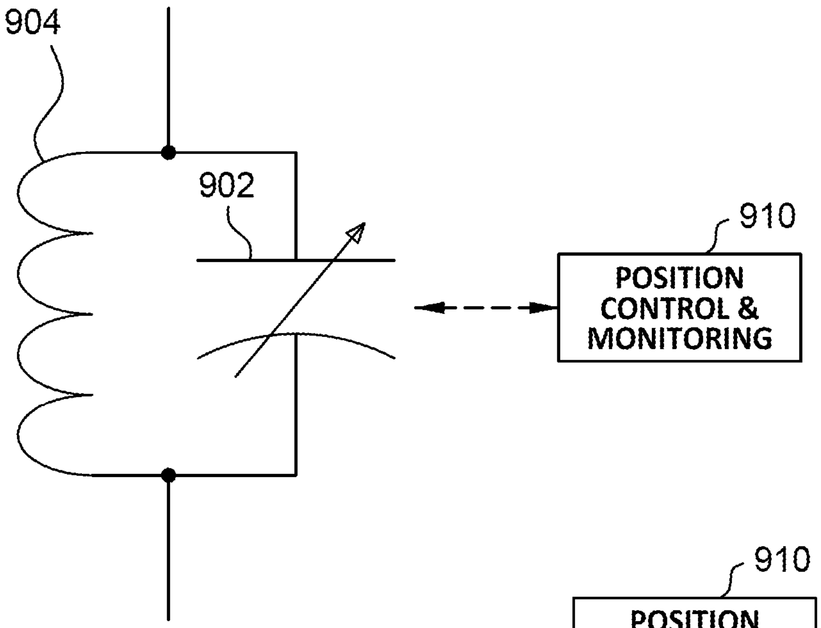
Figure 9C:
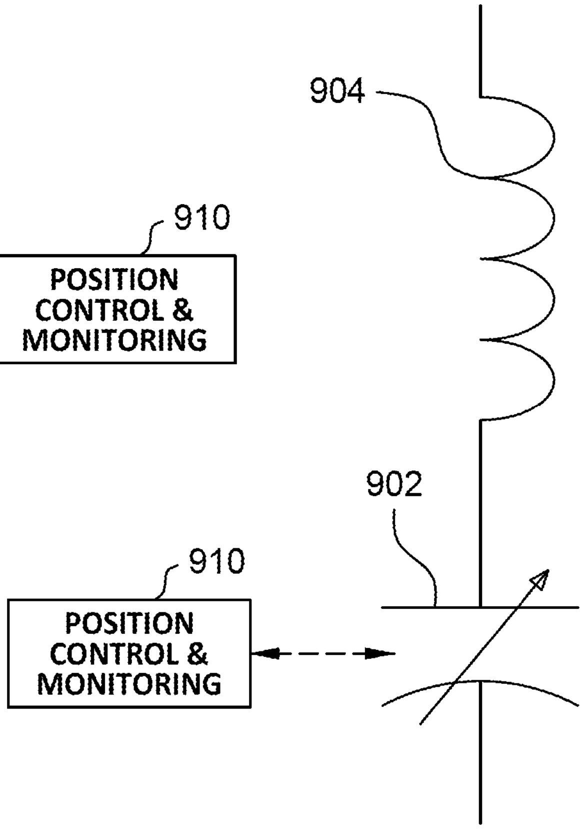

The impedance producing elements $X_1$, $X_2$, $X_3$, etc., within the circuit blocks 900*n* can be represented by the general nomenclature $X_{i+3n}$, where n=0, 1, 2, . . . and represents a circuit block number, and i=1, 2, 3 represents the impedance producing element's relative location within a circuit block, and the numeral "3" represents the number of electrical components in a circuit block. The impedance producing elements $X_{1+3n}$ are connected between the ground and the middle leg, the impedance producing elements $X_{2+3n}$ are connected between the input line of the tuning circuit (e.g., output 151 of the match network 146) and the middle leg, and the impedance producing elements $X_{3+3n}$ are connected in the middle leg. For example, within the circuit block $900_1$, n=1, the three impedance producing elements components are numbered with 4 (=1+3*1), 5 (=2+3*1) and 6 (=3+3*1), e.g., impedance producing elements $X_4$, $X_5$, and $X_6$. Each X_ in the circuit can be a capacitor (as shown in FIG. 9A), an inductor (as shown in FIG. 9B), a series connected inductor-capacitor (as shown in FIG. 9C) or a parallel connected inductor-capacitor (as shown in FIG. 9D). The restriction is to have at least one inductor and one variable capacitor in the two pairs $(X_{1+3N}, X_{2+3N})$ and $(X_{1+3N}, X_{3+3N})$ of each block, with N the index of the block. The variable capacitors are preferably in $X_{2+3N}$ and $X_{3+3N}$ rather than $X_{1+3N}$.

In at least some embodiments, every circuit block 900*n* has two pairs $(X_{1+3n}, X_{2+3n})$ and $(X_{1+3n}, X_{3+3n})$. For example, circuit block $900_0$ includes pairs $(X_1, X_2)$ and $(X_1, X_3)$, as shown in FIG. 8A. Each of the component pairs $(X_{1+3n}, X_{2+3n})$ or $(X_{1+3n}, X_{3+3n})$ includes at least one variable capacitor 902 (e.g., as shown in FIG. 9A, 9C), and/or 9D) and at least one inductor 904 (e.g., as shown in FIG. 9B, 9C, and/or 9D). For example, within circuit block $900_0$, n=0, the two pairs $(X_1, X_2)$ and $(X_1, X_3)$ each include a variable capacitor 902 (e.g., as shown in FIG. 9A, 9C, and/or 9D) and an inductor 904 (e.g., as shown in FIG. 9B, 9C, and/or 9D). Similarly, within circuit block $900_1$, n=1, the two pairs $(X_4, X_5)$ and $(X_4, X_6)$ each include the variable capacitor 902 (e.g., as shown in FIG. 9A, 9C, and/or 9D) and an inductor 904 (e.g., as shown in FIG. 9B, 9C, and/or 9D). Likewise, within circuit block $900_2$, n=2, the two pairs $(X_7, X_8)$ and $(X_7, X_9)$ each include the variable capacitor 902 (e.g., as shown in FIG. 9A, 9C, and/or 9D) and the inductor 904 (e.g., as shown in FIG. 9B, 9C, and/or 9D).

In at least some embodiments, if the impedance producing elements $X_{t+3n}$ in circuit block 900*n* do not include a series inductor (e.g., as shown in FIG. 9 (*a*), and/or (d)), a separate inductor 906 can be placed in the middle leg of the circuit block closer to the output. For example, in FIG. 8A, each circuit block 900*n* may comprise an inductor 906 in the middle leg. In at least some embodiments, the fourth inductor in the middle leg may not be included in the circuit block closest to the output of the tuning circuit 150.

As noted above, the tuning circuit 150 operates near resonance which enables the tuning circuit 150 to adjust a voltage higher and/or lower than the RF voltage at the output 151 of the matching network 146. Accordingly, each of the circuit blocks 900$n$ can tune up to two RF frequencies independently and at the same time, with at least two variable capacitors 902 within a circuit block, e.g., circuit block $900_0$. In some embodiments, one variable capacitor 902 in the circuit block 900$n$ can be used to tune one of the RF frequencies. Blocks can be connected in parallel between the input power supply and ground, with a large enough inductor 906 placed in the output line between blocks. The blocks for tuning higher frequencies are preferably closer to the output. When more than two RF frequencies need to be tuned at the same time, more than one circuit block of the circuit blocks 900$n$ can be connected in parallel, as described above and shown in FIG. 8A. When an odd number of RF frequencies need to be tuned simultaneously, one variable capacitor 902 in one of the impedance producing elements $X_{i+3n}$ can be replaced with a fixed capacitor (not shown), one of the impedance producing elements $X_{i+3n}$ need not be used, e.g., impedance producing element $X_5$ or $X_8$, or one of the impedance producing elements $X_{2+3N}$ or $X_{3+3N}$ can be deleted. The variable capacitor 902 may be from about 5 picofarads (pF) to about 500 pF, preferably from about 10 pF to about 250 pF. The inductance of inductor 904, in combination with the capacitor 902, may be selected based upon tuning to a specific resonant frequency.

Figure 8B:
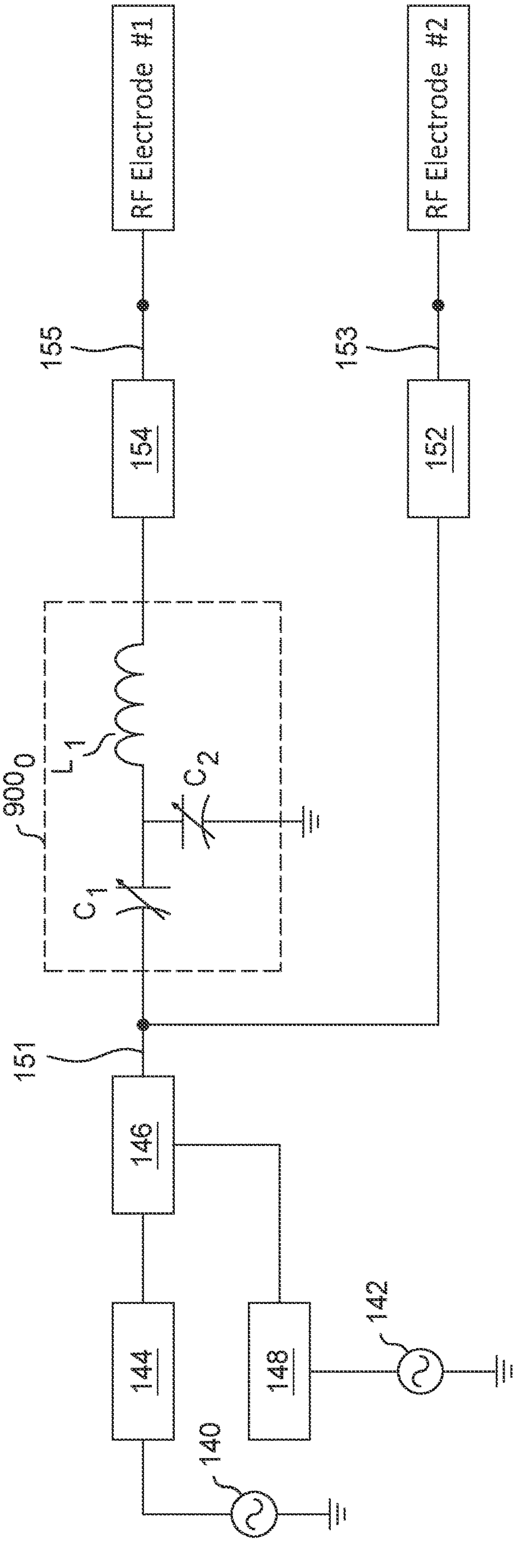
FIG. 8B illustrates an example of an RF tuning circuit that is coupled to RF power generation and matching and monitoring circuits, according to one or more embodiments of this disclosure.
Figure 8C:
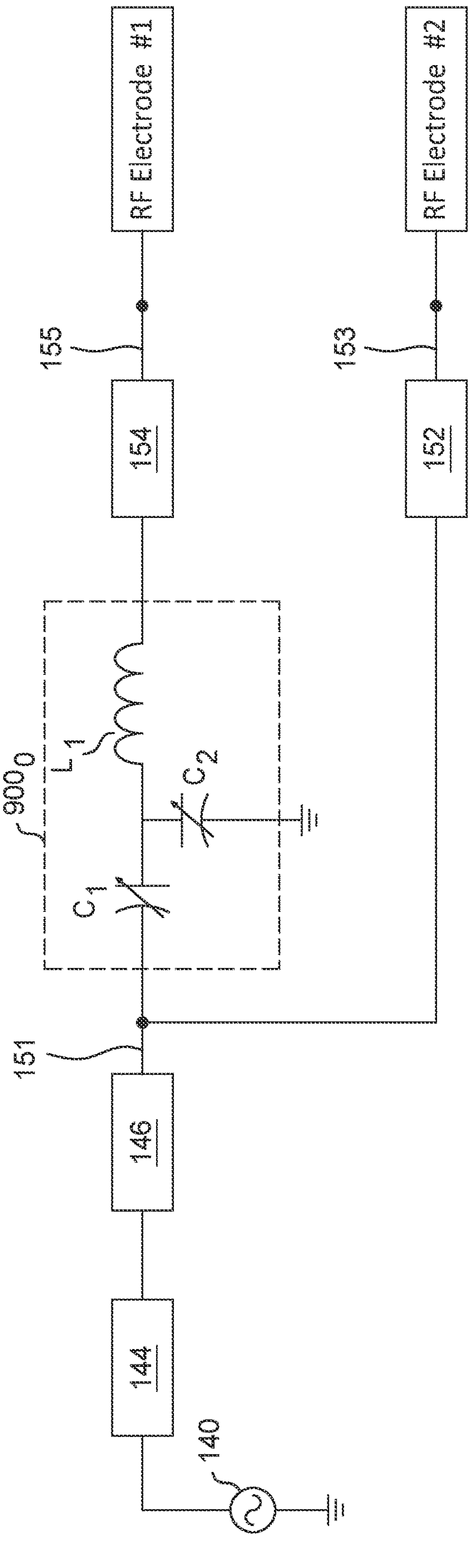
FIG. 8C illustrates another example of an RF tuning circuit that is coupled to RF power generation and matching and monitoring circuits, according to one or more embodiments of this disclosure.

FIGS. 8B and 8C illustrate examples of a tuning circuit 150 configuration that includes a single circuit block, such as circuit block $900_0$. In these examples, the tuning circuit 150 is coupled to one or more RF power generators, matching network(s) and monitoring circuits, according to one or more embodiments of this disclosure. The tuning circuit 150, shown in FIGS. 8B and 8C, includes an inductor $L_1$ (e.g., inductor 906) and the variable capacitor $C_1$ arranged in series (i.e., a serial LC resonant circuit illustrated in FIG. 9C) between the first RF electrode and the match network 146 (i.e., between the outer electrode 172 and the match network 146 (FIG. 4)) and a second variable capacitor $C_2$ that is coupled to a node that is disposed between the inductor $L_1$ and the variable capacitor $C_1$ within the power delivery line at the output 151 of the match network 146 and ground. In some embodiments, one or both of the variable capacitors $C_1$, $C_2$ are adjustable from at least about 2 pF to at least about 200 pF, such as from at least about 5 pF to about at least 250 pF.

Referring to FIGS. 10A and 10B and FIGS. 11A and 11B, which depict graphs of voltage amplitude ratio and phase difference in simulation settings between two RF tuning circuit outputs, according to one or more embodiments of this disclosure. The voltage amplitude and voltage phase difference between two RF electrodes are shown for one operational setting.

FIGS. 10A and 10B and FIGS. 11A and 11B illustrate non-limiting simulated results for the tuning circuit 150 configuration. In an effort to help explain the effect of adjusting one or more of the electrical elements within a tuning circuit 150 on the RF waveform characteristics provided to the electrodes within a multi-electrode source assembly, the tuning circuit 150 connection configuration shown in FIG. 4 is utilized in the description provided below. In this example, the inner electrode 170 is coupled to the output 151 of the match network 146 and the outer electrode 172 coupled to the tuning circuit 150.

Figure 10A:
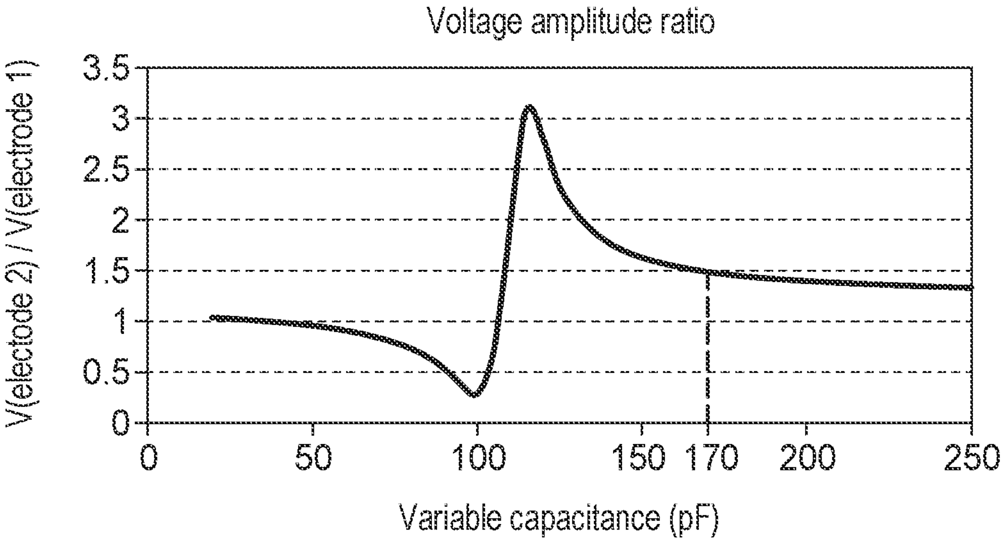
FIGS. 10A and 10B illustrate graphs of voltage amplitude ratio and phase difference in simulation settings between two RF tuning circuit outputs, according to one or more embodiments of this disclosure.
Figure 10B:
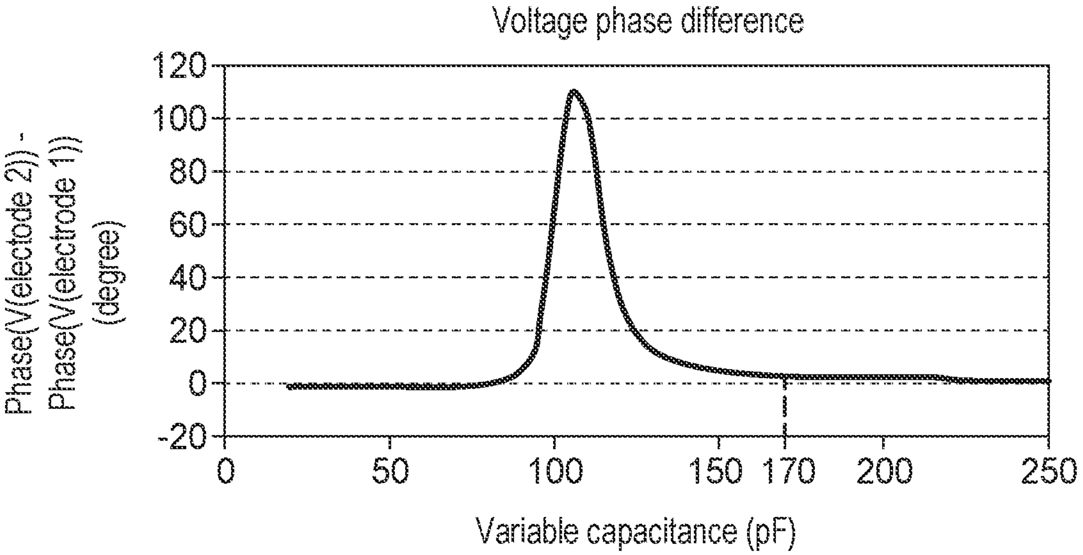
Figure 11A:
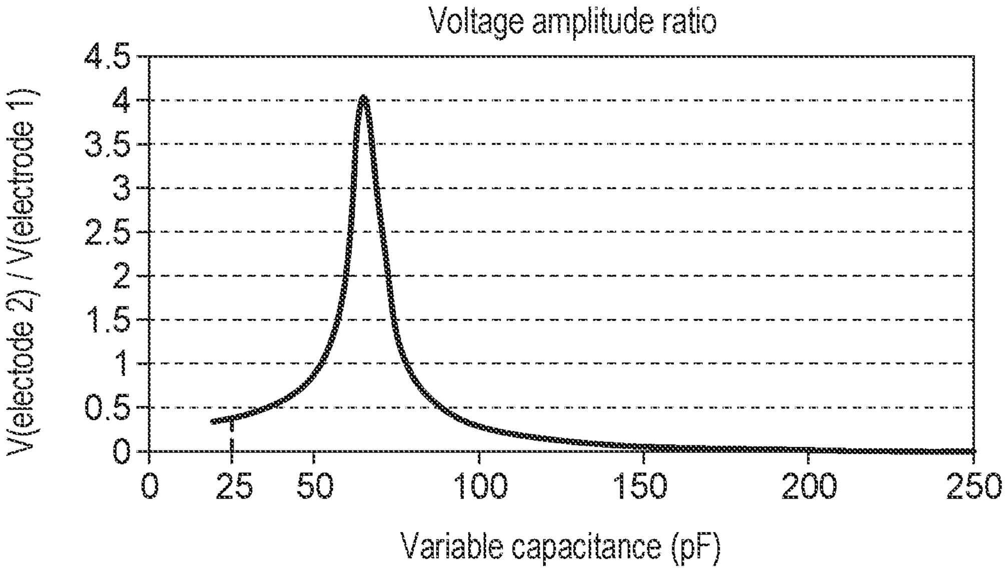
FIGS. 11A and 11B illustrate graphs of voltage amplitude ratio and phase difference in another simulation settings between two RF tuning circuit outputs, according to one or more embodiments of this disclosure.
Figure 11B:
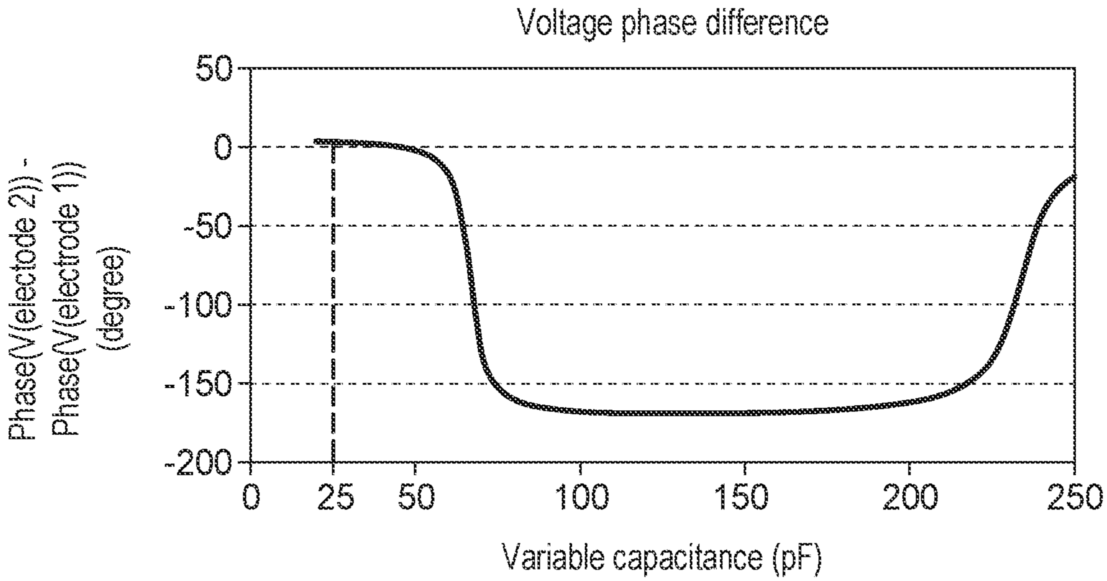

FIGS. 10A and 11A illustrate a simulated LC circuit tuning curve that illustrates the effect of varying the capacitance (e.g., variable capacitance $C_2$) in a tuning circuit 150 across a capacitance range on the ratio of voltage amplitude (e.g., $V_{RF2}/V_{RF1}$) between a first electrode (i.e., inner electrode 170) and a second electrode (i.e., outer electrode 172). In FIGS. 10B and 11B, the simulated results provide an example of LC circuit tuning curves that illustrate the effect that varying the capacitance (e.g., variable capacitance $C_2$) in a tuning circuit 150 has on the phase difference between the first electrode and the second electrode (e.g., $\Phi_{RF2}-\Phi_{RF1}$).

In this example, as shown in FIG. 10A, a variable capacitance C2 of the tuning circuit 150 having a value of about 170 pF has a corresponding voltage amplitude ratio (VRF2/VRF1) of about 1.5. As shown in FIG. 10B, the phase difference corresponding to the 170 pF capacitance for a tuning circuit 150 having the same configuration as in FIG. 10A is relatively small, e.g., less than 5 degrees, thus resulting in amplification of the RF waveform provided to the second electrode relative to the first RF waveform provided to the first electrode, and a small phase difference ($\Delta\Phi$) therebetween, as shown in FIGS. 10A and 10B. In this example, the amplified voltage amplitude ratio between electrodes results in corresponding increase in plasma density in the portion of the plasma 102 formed below the second electrode versus the first electrode due to the formed difference in the voltage amplitude ratio. However, in another example, as shown in FIG. 10A, a variable capacitance C2 of the tuning circuit 150 could also be adjusted to a value of about 75 pF so that the corresponding voltage amplitude ratio (VRF2/VRF1) of about 0.8 is achieved. In this example, the amplified voltage amplitude ratio between electrodes results in a corresponding increase in plasma density in the portion of the plasma 102 formed below the first electrode versus the second electrode. Therefore, by adjusting one or more of the impedance producing elements in the tuning circuit 150, characteristics of the plasma can be adjusted, such as plasma uniformity.

In FIGS. 11A-11B the variable capacitance $C_2$ of the tuning circuit 150 may be set to a value of about 25 pF and the resulting voltage amplitude ratio ($V_{RF2}/V_{RF1}$) is equal to about 0.5 (FIG. 11A), and the phase difference ($\Delta\Phi$) is about null, as shown in FIG. 11B.

As shown in FIG. 10A, the simulated results based on the tuning circuit 150 show resonance peaks at about 100 pF and about 120 pF. In FIG. 11B, the simulated results for the tuning circuit 150 show resonance phase transitions at 60 pF and 250 pF. In some embodiments, it may be desirable to operate the respective tuning circuit 150 at either side of the resonance during the period an RF plasma is maintained. In some embodiments, the tuning circuit 150 may be configured, e.g., by use of variable capacitors in combination of parallel and series LC circuits, to allow switching operation of the tuning circuit 150 between either side of a resonance peak without crossing through the resonant region. As noted above, the simulated results shown in FIGS. 10A-11B are not intended to be limiting as other tuning circuit 150 configurations may be used to provide other desired operating ranges for amplifying, reducing, and/or equalizing the voltage amplitude ratio ($V_{RF2}/V_{RF1}$) and/or a current amplitude ratio and/or phase difference between the RF waveforms provided to the electrodes.

In some embodiments, it may be desirable to select a tuning circuit 150 configuration and/or variable capacitance that causes a phase difference between the respective RF waveforms, which amplifies the electric field between electrodes, such as the inner electrode 170, which is directly coupled to the output 151 of the match network 146, and the outer electrode 172, which is coupled to the output 151 of the match network 146 through a tuning circuit 150. The amplified electric field results in a corresponding increase in plasma density in the portion of the plasma 102 formed over the substrate support assembly 114 at some controlled distance between the RF powered electrodes. Therefore, by making adjustments to one or more of the impedance producing elements in the tuning circuit 150, the amplified electric field provided to lateral spaced regions of the formed plasma can be adjusted and the associated plasma characteristics within the plasma in these regions can be adjusted over time to control the plasma properties (e.g., plasma non-uniformity). In some embodiments, it may be desirable to select a tuning circuit configuration and/or variable capacitance that does not cause a phase difference between the RF waveforms established at the respective electrodes so that the plasma density remains substantially uniform across the region spanning the substrate 106 (FIG. 1).

Beneficially, the tuning circuit 150 may be configured to provide a broad range of desired plasma processing conditions to control and/or adjust the plasma density distribution at different points between the center and edge of the substrate 106. The characteristics of the tuning circuit 150, and thus position of the system on the tuning curves (FIGS. 10A-11B) may be controlled using the system controller 126, by adjusting one or more variable capacitors within the one or more tuning circuit 150 coupled to one or more of the electrodes within a multi-electrode source assembly. The controlled adjustment of the characteristics of the one or more tuning circuits by the system controller 126 will allow for relatively easy changes in plasma processing conditions, within a single substrate plasma process, between consecutive substrate plasma processes, and/or for different types of substrates, without the need for manually changing hardware related configurations. In some embodiments, one or both of the RF generators 140, 142, the tuning circuit 150, or combinations thereof may be used to adjust the plasma characteristics during plasma processing.

In some embodiments, the tuning circuit 150 is automatically adjusted to maintain desired processing conditions, such as to account for plasma uniformity drift due to changes in the geometries and/or materials of the various components of the processing chamber 110 over time. For example, the methods may be used to automatically adjust the tuning circuit 150, such as by changing a capacitance in the tuning circuit, to account for changes in the thickness of the edge ring 116 that may be caused by erosion of the dielectric material from the edge ring 116 due to ion bombardment. For example, in some embodiments, the system controller 126, by use of the sensors 152, 154, may be configured to detect signals of one or more electrical parameters at corresponding nodes N of the processing chamber 110; determine whether the processing chamber is operating within desired processing conditions by comparing the characteristics of the detected signals with one or more control limits; and, when the electrical signal characteristics are outside of the control limits, adjust one or more components of the tuning circuit 150. Some embodiments include automatically adjusting one or more of the impedance producing elements of the tuning circuit 150 to maintain a desired RF voltage amplitude ratio, RF current amplitude ratio, and/or RF phase difference between the different RF waveforms provided to each of the electrodes within the multi-electrode source assembly.

In some embodiments, the system controller 126 is configured to automatically adjust the tuning circuit 150 based on desired processing conditions and/or desired characteristics between the RF waveform at a first electrode and a second electrode by comparing the processing condition(s) and/or RF waveforms to predetermined limits, e.g., control limits, and changing one or more set points of an impedance producing element, such as a variable capacitance, of the tuning circuit 150 based on an algorithm or lookup table stored in memory 134 of the system controller 126.

In some embodiments, the tuning circuit 150 may be manually adjusted and/or controlled by adjusting one or more components of the tuning circuit 150 to a desired set point, and/or within desired control limits, where the desired set point and/or control limits are selected by a user and stored in the instructions used to control the processing chamber 110. For example, a variable capacitance of the tuning circuit 150 may be controlled to a desired capacitance determined by a user and stored in memory of the system controller 126.

Figure 12:
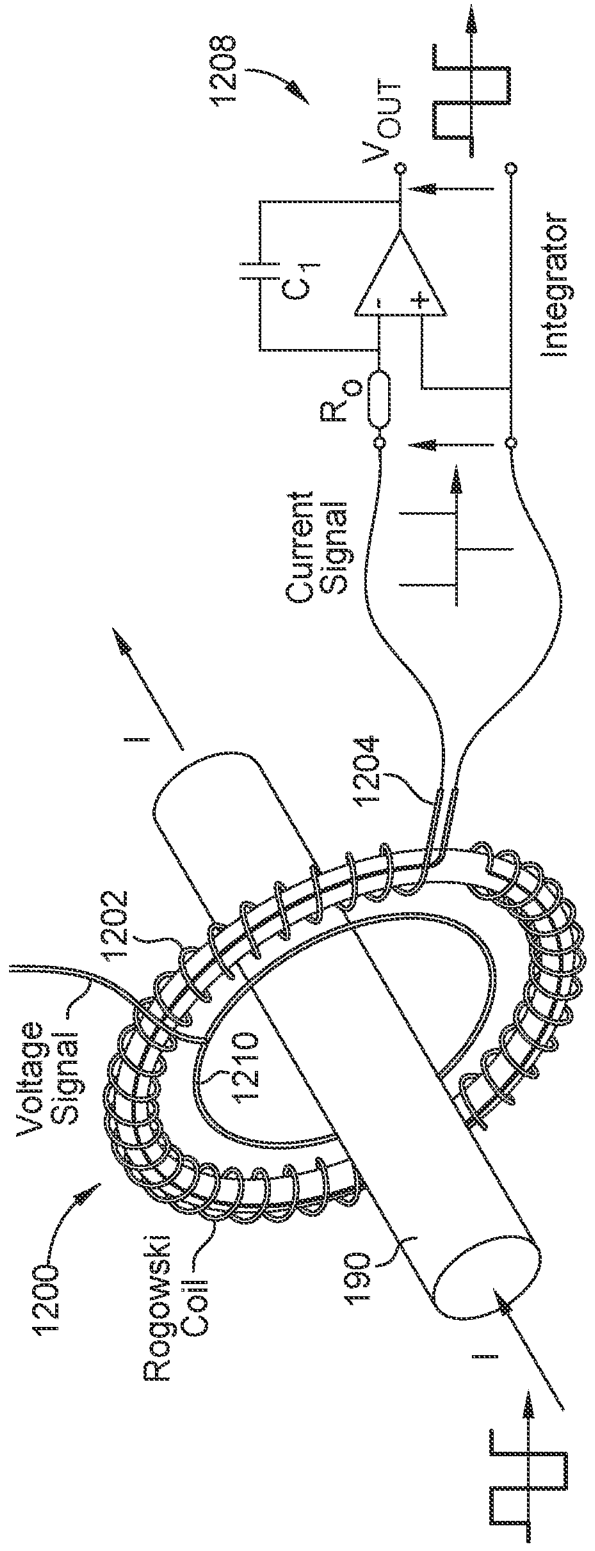
FIG. 12 illustrates a schematic isometric drawing of RF voltage and current detectors, according to one or more embodiments of this disclosure.

Referring to FIG. 12, depicted is a schematic isometric drawing of RF voltage and current detectors, according to one or more embodiments of this disclosure. A Rogowski coil 1200 for measuring alternating current (AC) or high-speed current pulses is shown. The Rogowski coil 1200 may comprise a helically wound current coil 1202 with the lead from one end returning through the centre of the current coil 1202 to the other end so that both terminals are at the same end 1204 of the current coil 1202. This approach is sometimes referred to as a "counter-wound Rogowski coil." The current coil 1202 encircles a straight conductor 190 (RF conductor from the RF power generator 140/142 whose RF current is to be measured). A voltage is induced in the current coil 1202 that is proportional to the rate of change (derivative) of current in the straight conductor 190, the output of the Rogowski coil 1200 is usually connected to an electronic integrator circuit 1208 for providing an output signal that is proportional to the current in the conductor 190. It is contemplated and within the scope of this disclosure that any shape of the coil 1200 may be implemented, such as but is not limited to, square, circular, rectangular, or hexagon; and may be fabricated on a printed circuit board. A voltage detection coil 1210 may be used for detecting the RF voltage on the conductor 190. The voltage detection coil 1210 may use both capacitive and inductive coupling to the conductor 190 and has a high impedance when referenced to common or ground.

Figure 13:
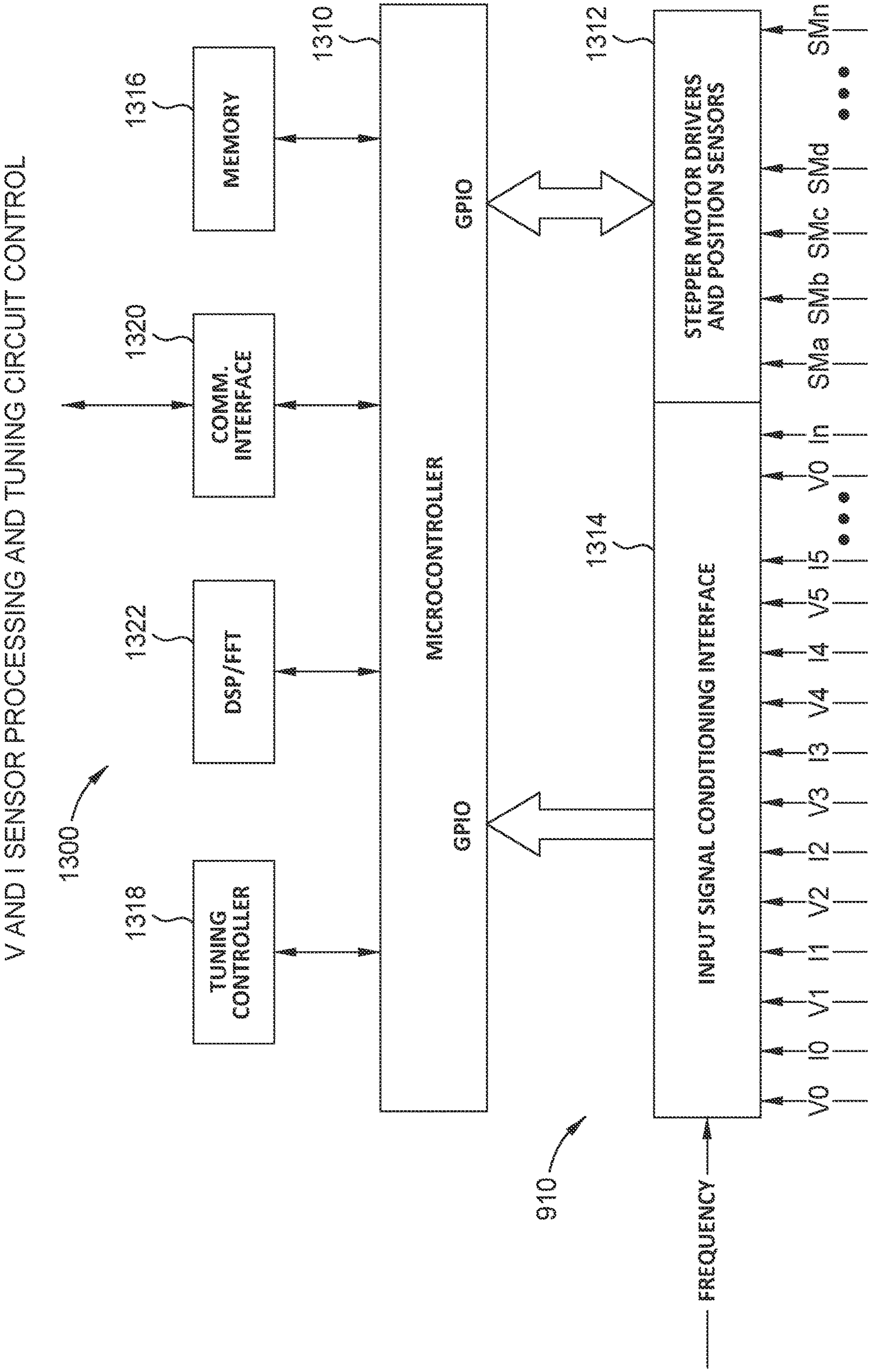
FIG. 13 illustrates a schematic block diagram of an RF voltage and current sensor processing and tuning circuit controller, according to one or more embodiments of this disclosure.

Referring to FIG. 13, depicted is a schematic block diagram of an RF voltage and current sensor processing and tuning circuit controller, according to one or more embodiments of this disclosure. The RF voltage and current sensor processing and tuning circuit controller, generally represented by the numeral 1300, may comprise a microcontroller 1310, a memory 1316, a communications interface 1320, RF electrode tuning controls 1318, input signal conditioning 1314, stepper motor drivers and position sensors 1312. The microcontroller 1310 may have a digital signal processing (DSP) and fast Fourier transform (FFT) capabilities in either an internal core processor or an external DSP/FFT processor 1322. The microcontroller 1310 may provide general purpose inputs and outputs (GPIO) for coupling to the input signal conditioning interface 1314, and the stepper motor drivers and position sensors 1312. Inputs of the signal conditioning interface 1314 are coupled to respective ones of the VI sensors 152/154. The stepper motor drivers and position sensors 1312 are coupled to respective ones of the variable capacitor position control and monitoring circuits 910. The RF voltage V(t) and RF current I(t) measurements from each of the VI sensors may be input in real time to the microcontroller 1310. The microcontroller 1310 may then determine the amplitude ratio and/or phase difference between each RF voltage V(t) and RF current I(t) sensor pair 152/154. Tuning controls 1318 may be used to adjust the variable capacitor 902 of the tuning circuit 150, e.g., adjust resonant frequency thereof. The communications interface 1320 may be adapted to communicate with an operator display (not shown) such a laptop computer and/or tool controller for providing VI sensor readings, VI phase difference, and capacitor position information to an operator and/or for process historical recording.

Figure 14:
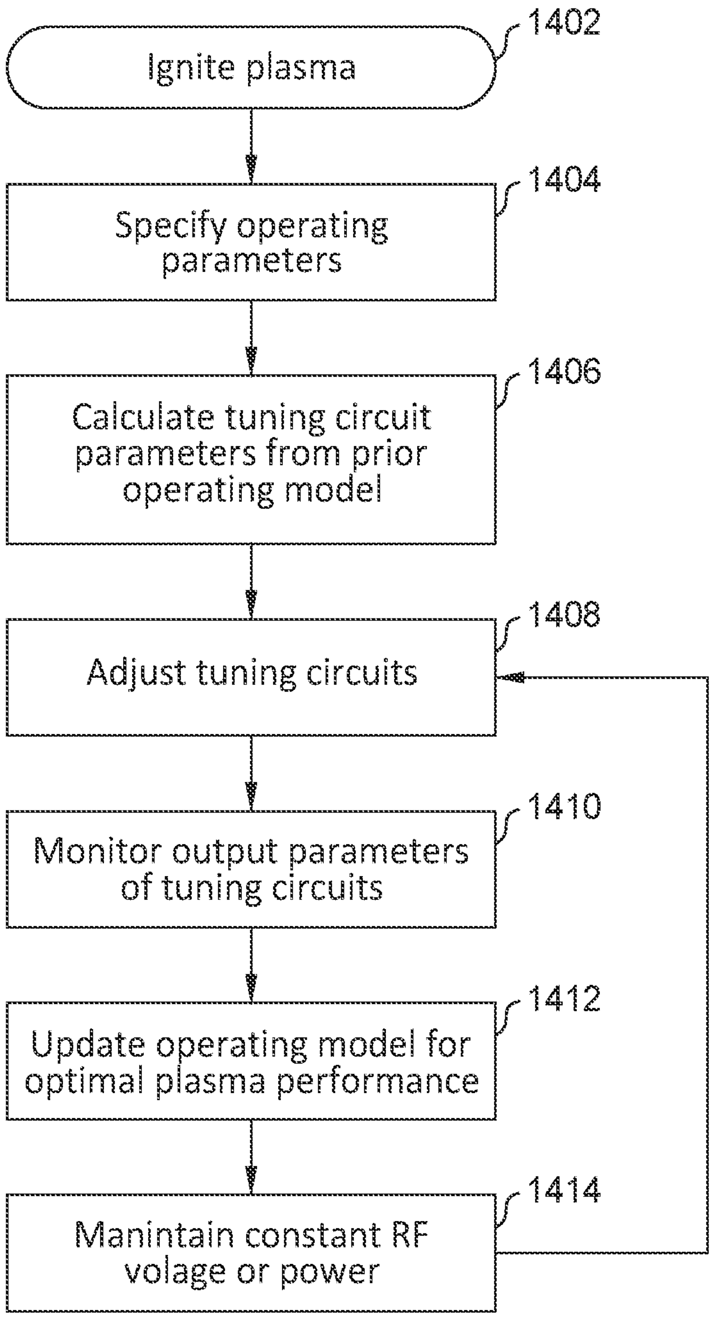
FIG. 14 illustrates a schematic operational flow diagram for adjusting the RF tuning circuits to control radial uniformity of process plasma in a chamber, according to one or more embodiments of this disclosure.

Referring to FIG. 14, depicted is a schematic operational flow diagram for adjusting the RF tuning circuits to control radial uniformity of process plasma in a chamber, according to one or more embodiments of this disclosure. In step 1402, the process plasma is ignited. In some embodiments, the plasma generated at activity 1402 is a capacitively coupled plasma (CCP) generated using a radio frequency (RF) signal from an RF waveform generator, such as either RF generator 140 or 142 that is electrically coupled to one of the electrodes within the multi-electrode source assembly, such as, for example, electrically coupled to the inner electrode 170 and/or outer electrode 172 shown in FIG. 4. In some embodiments, the RF signal used to generate the plasma has a frequency that is greater than 400 kHz, such as a frequency of about 1 MHz or more, or about 2 MHz or more, such as about 13.56 MHz or more, about 27 MHz or more, about 40 MHz or more, or, for example, between about 30 MHz and about 200 MHz, such as between about 30 MHz and about 160 MHz, between about 30 MHz and about 120 MHz, or between about 30 MHz and about 60 MHz.

During step 1402, an RF voltage or RF power is delivered to the electrodes within the multi-electrode source assembly, such as, for example, the inner electrode 170 and/or outer electrode 172 shown in FIG. 4 according to a process recipe stored in the system controller. The RF voltage or RF power is applied to at least one of the electrodes within the multi-electrode source assembly through a tuning circuit.

In step 1404, operating parameters used to control the generated plasma's characteristics (e.g., plasma density) in various regions over a surface of a substrate and/or within various regions of the processing volume of the plasma processing chamber are defined and stored in memory of the system controller. In one example, the operating parameters include defining a difference in the desired RF signal characteristics that are to be applied to a first electrode (e.g., inner electrode 170) and a second electrode (e.g., outer electrode 172) to control the plasma density at various radial positions within the processing volume of the plasma processing chamber. The operating parameters can include the adjustments that are to be made to one or more components within the tuning circuits 150 coupled to the first electrode and/or second electrode, RF voltage, RF current, power ratios or desired phase difference values. The selection of the operating parameters can be based on input received from a user or based on coded instructions found within software running on the system controller 126 and input received from the VI sensors 152, 154. The selection of operating parameters can be based on a prior process results or an analysis of collected sensor data that is used to decide whether the plasma density, and/or one or more plasma properties, needs to be higher or lower within one or more regions of the processing volume of the plasma processing chamber.

In step 1406, based on the selected operating parameters the tuning circuit parameters are calculated from a prior developed tuning circuit operating model stored in memory. The tuning circuit parameters generated by use of the prior developed operating model can include a moving direction and/or a desired capacitance value for at least one variable capacitor 902 of the tuning circuit 150, or by use of a user specified capacitance value for the at least one variable capacitor 902.

In step 1408, the at least one variable capacitor 902 of the tuning circuit 150 may be adjusted to a specified value using the tuning circuit parameters generated in step 1406 and/or stored in the memory 134 of the CPU 133.

In step 1410, the output parameters, e.g., RF voltage, current and phase angle therebetween at each output of the tuning circuits 150 are controlled and monitored using the VI sensors 154, 152 and the RF voltage and current sensor processing and tuning circuit controller 1300 shown in FIG. 13 and described hereinabove.

In step 1412, the tuning circuit operating model is updated for optimal plasma processing performance, e.g., the variable capacitor capacitance value or tuning direction is updated to achieve the largest voltage or current ratio, or phase difference between RF feeds referenced to the RF electrodes 170, 172. The desired adjustments can be based on the sensor data collected by the VI sensors 154, 152.

In step 1414, the RF voltage or power at the output of an RF electrode tuning circuit is maintained at a value according to a process recipe, and if necessary return back to step 1408 so that the tuning circuit 150 and plasma processing results can be further improved.

The present disclosure has been described in terms of one or more embodiments, and it should be appreciated that many equivalents, alternatives, variations, and modifications, aside from those expressly stated, are possible and within the scope of the disclosure.

What is claimed is:

1. A plasma processing chamber, comprising:

a substrate support assembly that comprises a substrate supporting surface that at least partially defines a processing region of the plasma processing chamber;

a first electrode having a lower surface that is positioned over at least a portion of the substrate supporting surface, is substantially parallel to a first plane, and is a first distance from the substrate supporting surface in a first direction that is perpendicular to the first plane;

a second electrode having a lower surface that is substantially parallel to the first plane, wherein the second electrode and the first electrode are spaced a distance apart in a second direction that is parallel to the first plane;

a radio frequency (RF) power source assembly comprising:

a first RF generator, an impedance matching network having an input coupled to an output of the first RF generator and an output coupled to the first electrode, and a tuning circuit having an input coupled to the output of the impedance matching network and an output coupled to the second electrode, wherein the tuning circuit comprises a plurality of impedance producing elements that comprise a first variable impedance producing element; and a controller configured to control the impedance of the first variable impedance producing element to cause an RF phase difference or an RF amplitude change between a first RF waveform provided to the first electrode and a phase shifted or an amplitude changed first RF waveform provided to the second electrode through the first variable impedance producing element of the tuning circuit.

2. The plasma processing chamber of claim 1, further comprising:

a second RF generator having an output coupled to another input of the impedance matching network, wherein the second RF generator is configured to provide a second RF waveform to the first electrode provided through the impedance matching network, and a phase shifted second RF waveform provided to the second electrode through the first variable impedance producing element of the tuning circuit; and frequencies of the first and second RF waveforms are different.

3. The plasma processing chamber of claim 1, wherein the first RF waveform provided to the first electrode and the phase shifted first RF waveform provided to the second electrode are different in amplitude.

4. The plasma processing chamber of claim 2, wherein the second RF waveform provided to the first electrode and the second RF waveform provided to the second electrode are different in phase and amplitude.

5. The plasma processing chamber of claim 2, wherein the first variable impedance producing element of the tuning circuit is configured to simultaneously tune at least one of an RF amplitude or an RF phase of the first and second RF waveforms coupled to the second electrode.

6. The plasma processing chamber of claim 2, wherein the first variable impedance producing element of the tuning circuit adjusts a phase difference between first RF waveform at the first electrode and the first RF waveform at the second electrode.

7. The plasma processing chamber of claim 2, wherein the first variable impedance producing element of the tuning circuit adjusts an amplitude difference between first RF waveform at the first electrode and the first RF waveform at the second electrode.

8. The plasma processing chamber of claim 1, wherein the tuning circuit operates near a frequency resonance of the first RF waveform and the plurality of impedance producing elements each comprises one or more circuit blocks, each of the one or more circuit blocks includes one or more electrical components.

9. The plasma processing chamber of claim 2, wherein the tuning circuit operates near a frequency resonance of the second RF waveform and the plurality of impedance producing elements each comprises one or more circuit blocks, each of the one or more circuit blocks includes two or more electrical components in which two or more variable capacitors are disposed.

10. The plasma processing chamber of claim 8, wherein the one or more electrical components include a variable capacitor.

11. The plasma processing chamber of claim 1, wherein the second electrode encircles the first electrode on the first plane.

12. The plasma processing chamber of claim 1, further comprising a third electrode between the first and second electrodes, wherein the third electrode is aligned substantially parallel to the first plane.

13. The plasma processing chamber of claim 12, wherein another tuning circuit is coupled between the impedance matching circuit and the third electrode.

14. The plasma processing chamber of claim 1, wherein the first electrode comprises a plurality of first electrode segments.

15. The plasma processing chamber of claim 14, further comprising a plurality of other tuning circuits, each one of the plurality of tuning circuits is coupled to a respective one of the plurality of first electrode segments.

16. The plasma processing chamber of claim 12, wherein the third electrode comprises a plurality of third electrode segments.

17. The plasma processing chamber of claim 16, further comprising a plurality of other tuning circuits, each one of the plurality of other tuning circuits is coupled to a respective one of the plurality of third electrode segments.

18. The plasma processing chamber of claim 1, further comprising:

a non-transitory computer-readable medium having instructions for performing a method, the method comprising:

(a) providing the first RF waveform at the first electrode and the phase shifted first RF waveform at the second electrode; and (b) adjusting, by use of the first variable impedance producing element of the tuning circuit, one or more characteristics of the phase shifted first RF waveform at the second electrode relative to the first RF waveform at the first electrode.

19. A plasma processing chamber, comprising:

a substrate support assembly that comprises a substrate supporting surface that at least partially defines a processing region of the plasma processing chamber;

a first electrode having a lower surface that is positioned over at least a portion of the substrate supporting surface, is substantially parallel to a first plane, and is a first distance from the substrate supporting surface in a first direction that is perpendicular to the first plane;

a second electrode having a lower surface that is substantially parallel to the first plane, wherein the second electrode and the first electrode are spaced a distance apart in a second direction that is parallel to the first plane;

a radio frequency (RF) power source assembly comprising:

a first RF generator configured to provide an RF signal at a first RF frequency, an impedance matching network having an input coupled to an output of the first RF generator and an output coupled to the first electrode, and a tuning circuit having an input coupled to the output of the impedance matching network and an output coupled to the second electrode, wherein the tuning circuit comprises an LC circuit that has a resonant frequency at the first RF frequency, and comprises a first variable capacitor and a first inductor; and a controller configured to control the impedance of the first variable capacitor to cause an RF voltage and/or phase difference between a first RF waveform provided to the first electrode and the first RF waveform provided to the second electrode through the tuning circuit.

20. A plasma processing method, comprising:

(a) generating a plasma in a processing region defined between an electrode assembly and a substrate supporting surface of a substrate support assembly, wherein the electrode assembly comprises a first electrode and a second electrode, the second electrode is positioned a distance from the first electrode in a first direction, a first radio frequency (RF) generator having an RF output, through an impedance matching network, that is coupled to the first electrode, and a tuning circuit coupled between the impedance matching network and the second electrode, wherein the tuning circuit comprises a plurality of impedance producing elements that comprise a first variable impedance producing element;

(b) generating, by the first RF generator, an RF waveform, wherein the generated RF waveform establishes a first RF waveform at the first electrode and a second RF waveform at the second electrode; and (c) altering the generated plasma by adjusting the first variable impedance producing element of the tuning circuit, wherein adjusting the first variable impedance producing element alters one or more characteristics of the second RF waveform relative to the first RF waveform.

21. The method of claim 20, wherein the one or more characteristics of the second RF waveform relative to the first RF waveform are phase and amplitude.

22. The method of claim 20, further comprising:

measuring RF voltages and RF currents at the first and second electrodes;

calculating RF amplitude and RF phase at the substrate and the first and second electrodes;

adjusting at least one variable capacitor in the first variable impedance producing element to a capacitance value based on a calculated RF amplitude and RF phase, to manipulate at least one of the RF voltage, the RF current, or the RF phase at the second electrode relative to the first electrode; and adjusting an output power of the RF generator to maintain constant RF voltages at the first and second electrodes while adjusting the at least one variable capacitor in the tuning circuit.

23. The method of claim 20, further comprising:

(d) concurrent with (b) and/or (c), establishing a pulsed voltage (PV) waveform at an edge control electrode in the substrate support assembly.

* * * * *